US009653266B2

(12) United States Patent
Chen et al.

(10) Patent No.: US 9,653,266 B2
(45) Date of Patent: May 16, 2017

(54) MICROWAVE PLASMA APPLICATOR WITH IMPROVED POWER UNIFORMITY

(71) Applicant: MKS Instruments, Inc., Andover, MA (US)

(72) Inventors: Xing Chen, Lexington, MA (US); Chengxiang Ji, Winchester, MA (US); Erin Madden, Lynnfield, MA (US); Ilya Pokidov, North Reading, MA (US); Kevin W. Wenzel, Belmont, MA (US)

(73) Assignee: MKS Instruments, Inc., Andover, MA (US)

(*) Notice: Subject to any disclaimer, the term of this patent is extended or adjusted under 35 U.S.C. 154(b) by 0 days.

(21) Appl. No.: 14/645,837

(22) Filed: Mar. 12, 2015

(65) Prior Publication Data
US 2015/0318148 A1 Nov. 5, 2015

Related U.S. Application Data

(63) Continuation-in-part of application No. 14/226,994, filed on Mar. 27, 2014.

(51) Int. Cl.
*H01J 37/32* (2006.01)
*H05H 1/46* (2006.01)

(52) U.S. Cl.
CPC .. *H01J 37/32229* (2013.01); *H01J 37/32201* (2013.01); *H01J 37/32311* (2013.01);
(Continued)

(58) Field of Classification Search
CPC ........... H01J 37/32192; H01J 37/32229; H01J 37/32522
(Continued)

(56) References Cited

U.S. PATENT DOCUMENTS 4,207,452 A * 6/1980 Arai ...................... H05B 6/802
 219/687
4,908,492 A 3/1990 Okamoto et al.
(Continued)

FOREIGN PATENT DOCUMENTS

JP 2107778 4/1990
JP 02107778 A * 4/1990
(Continued)

OTHER PUBLICATIONS

International Search Report mailed May 27, 2015 in International Application no. PCT/US2015/021382 filed Mar. 19, 2015.

*Primary Examiner* — Tuyet Vo
*Assistant Examiner* — Amy Yang
(74) *Attorney, Agent, or Firm* — Burns & Levinson, LLP; Joseph M. Maraia; Steven M. Mills

(57) ABSTRACT

An apparatus for generating plasma includes a plasma discharge tube and a conductive coil helically wound around an outer surface of the plasma discharge tube. A waveguide is coupled to a microwave cavity surrounding the plasma discharge tube to guide the microwave energy into the plasma discharge tube such that the plasma is generated in the plasma discharge tube. The waveguide is positioned such that an electric field of the microwave energy is oriented at a predetermined angle with respect to the longitudinal axis of the plasma discharge tube. A resulting induced electric current in the conductive coil affects power absorption in the plasma discharge tube, the predetermined angle being selectable such that power absorption in the plasma discharge tube is according to a predetermined profile with respect to the longitudinal axis of the plasma discharge tube.

51 Claims, 16 Drawing Sheets

(52) U.S. Cl.
CPC ......... *H01J 37/32522* (2013.01); *H05H 1/46* (2013.01); *H05H 2001/4622* (2013.01)

(58) Field of Classification Search
USPC .................... 315/111.21, 111.41, 111.51, 39
See application file for complete search history.

(56) References Cited

U.S. PATENT DOCUMENTS

| | | | |
|---|---|---|---|
| 5,625,259 A | 4/1997 | Holber et al. | |
| 6,150,628 A | 11/2000 | Smith et al. | |
| 6,263,830 B1 * | 7/2001 | Kamarehi | H01J 37/32192 118/723 ME |
| 2004/0262268 A1 * | 12/2004 | Wu | H05H 1/30 219/121.36 |
| 2006/0124244 A1 * | 6/2006 | Ishii | H01J 37/32192 156/345.42 |
| 2008/0011231 A1 | 1/2008 | Kim | |
| 2010/0101728 A1 * | 4/2010 | Iwasaki | H01J 37/32192 156/345.33 |

FOREIGN PATENT DOCUMENTS

| | | |
|---|---|---|
| WO | 0061384 | 10/2000 |
| WO | 03026365 | 3/2003 |

\* cited by examiner

MICROWAVE PLASMA APPLICATOR WITH IMPROVED POWER UNIFORMITY

RELATED APPLICATION

This application is a continuation-in-part (CIP) of copending U.S. patent application Ser. No. 14/226,994, filed in the U.S. Patent and Trademark Office on Mar. 27, 2014, the entire contents of which are incorporated herein by reference.

BACKGROUND

1. Technical Field

This disclosure is related to microwave plasma systems and, more particularly, to a fluid-cooled microwave plasma applicator for producing reactive gaseous species for processing applications.

2. Discussion of Related Art

Reactive gases and gas mixtures are used in many industrial operations including the processing of materials such as semiconductor wafers for fabricating electronic and optical devices. Reactive gases can be used, for example, in thin film deposition and etching in microelectronics manufacturing to etch dielectric and semiconductor materials or various masking films such as photoresist and polyimide. Reactive gasses can be used to form dielectric films and metal films, and can also be used to clean wafer surfaces in various stages of wafer processing.

Reactive species of gas molecules can be produced by exciting gas molecules in a plasma discharge. The discharge can be created with a plasma source by coupling energy into a plasma discharge tube or a dielectric window on a chamber containing the gas. Microwave energy is often used as the energy source to create and sustain a plasma discharge. A typical microwave frequency used for creating plasma discharges is 2.45 GHz, due to the availability of power sources and system components.

It is desirable to have a plasma source which is capable of producing a large quantity of various reactive gaseous species under very clean conditions. Examples of desirable species include the various atomic halogens (atomic fluorine, chlorine, bromine, etc.), atomic oxygen, atomic nitrogen, and atomic hydrogen. One technical difficulty in using microwave energy for creating a large quantity of reactive gaseous species in a plasma source is cooling the plasma discharge tube or dielectric window. Air cooling can be used for the plasma discharge tube, but it is relatively inefficient compared with liquid cooling. In addition, air cooling requires relatively large and expensive air blowers or compressors to remove a sufficient amount of heat. Also, air cooling may not be compatible with modern clean room environments used for manufacturing semiconductors.

Liquid cooling is advantageous because it is efficient. Water cooling is particularly desirable because water has high heat capacity, and it is both safe to handle and environmentally benign. Also, chilled water is readily available in nearly all manufacturing, university and research and development facilities. A barrier to using water for cooling microwave plasma discharge tubes is that water also readily absorbs microwave energy. Similarly, many other desirable cooling liquids readily absorb microwave energy.

Certain fluids such as silicone oils, some chlorofluorocarbons, and various hydrocarbon compounds do not absorb microwave energy and thus can be used to cool the outside of a plasma discharge tube. Unfortunately, these fluids are often environmentally undesirable, hazardous to handle, and expensive. In addition, using these fluids requires the use of closed-loop heat exchangers, which further increases the cost and complexity of the system.

A number of techniques have been used to generate plasmas and to produce activated gases. These include capacitively coupled discharges, inductively coupled discharges and microwave discharges. None of the prior devices have been adequate for producing high-flow-rate, contamination-free, chemically activated gases useful for industrial applications.

SUMMARY

According to one aspect, an apparatus for generating plasma is provided. The apparatus includes a plasma discharge tube being substantially transparent to microwave energy and having a longitudinal axis. A conductive coil comprising an electrically conductive material is substantially helically wound around an outer surface of the plasma discharge tube. A microwave cavity surrounds the plasma discharge tube. A waveguide is coupled to the microwave cavity for guiding the microwave energy into the plasma discharge tube such that the plasma is generated in the plasma discharge tube. The waveguide has a major cross-sectional axis and a minor cross-sectional axis, the major and minor cross-sectional axes being positioned with respect to the longitudinal axis of the plasma discharge tube such that an electric field of the microwave energy is oriented at a predetermined angle with respect to the longitudinal axis of the plasma discharge tube. The electric field of the microwave energy induces an electric current in the conductive coil, the electric current affecting power absorption in the plasma discharge tube, the predetermined angle being selectable such that power absorption in the plasma discharge tube is according to a predetermined profile with respect to the longitudinal axis of the plasma discharge tube.

In some exemplary embodiments, the predetermined angle is such that the electric field is oriented substantially perpendicular to the longitudinal axis of the plasma discharge tube. In some exemplary embodiments, the predetermined angle is such that the electric field is oriented at an angle of 30° to 90° with respect to the longitudinal axis of the plasma discharge tube. In some exemplary embodiments, the predetermined angle is such that the electric field is oriented at an angle of 45° to 90° with respect to the longitudinal axis of the plasma discharge tube. In some exemplary embodiments, the predetermined angle is selected to increase uniformity of power absorption with respect to the longitudinal axis of the plasma discharge tube.

In some exemplary embodiments, the conductive coil comprises a plurality of loops around the plasma discharge tube, the plurality of loops defining a pattern of spacing between adjacent loops, the pattern of spacing being selectable based on a predetermined desired effect of the current induced in the conductive coil on the power absorption in the plasma discharge tube. In some exemplary embodiments, the pattern of spacing between adjacent loops is selected to increase uniformity of power absorption with respect to the longitudinal axis of the plasma discharge tube. In some exemplary embodiments, the spacing between selected adjacent loops can be decreased to increase the electric current induced in the conductive coil such that propagation of microwave energy in the plasma discharge tube in proximity to the selected adjacent loops increases. In some exemplary embodiments, the spacing between selected adjacent loops can be increased to decrease the electric current induced in the conductive coil such that propagation of microwave energy in the plasma discharge tube in proximity to the selected adjacent loops decreases.

In some exemplary embodiments, the conductive coil is thermally coupled to the plasma discharge tube, and the conductive coil comprises a channel through which a cooling fluid can flow, such that the cooling fluid removes heat from the plasma discharge tube. The spacing between adjacent loops can be selected to control temperature of the plasma discharge tube.

In some exemplary embodiments, the apparatus further comprises a microwave choke at each of two ends of the conductive coil, the microwave chokes substantially preventing leakage of the microwave energy from the plasma discharge tube.

In some exemplary embodiments, the conductive coil is helically wound around the outer surface of the plasma discharge tube.

In some exemplary embodiments, a controller controls the predetermined angle between the electric field of the microwave energy and the longitudinal axis of the plasma discharge tube. The apparatus can include at least one of an electromagnetic field sensor for generating a first signal indicative of electromagnetic field intensity in the plasma discharge tube and a temperature sensor for generating a second signal indicative of temperature in the plasma discharge tube, and the controller controls the predetermined angle based on at least one of the first and second signals. The apparatus can include at least one actuator for rotating the waveguide with respect to the plasma discharge tube to adjust the predetermined angle, the controller controlling the at least one actuator to control the predetermined angle.

According to another aspect, an apparatus for generating plasma is provided. The apparatus includes a plasma discharge tube being substantially transparent to microwave energy and having a longitudinal axis. A conductive coil comprising an electrically conductive material is substantially helically wound around an outer surface of the plasma discharge tube. An electric field of the microwave energy induces an electric current in the conductive coil, and the electric current affects power absorption in the plasma discharge tube. A microwave cavity surrounds the plasma discharge tube. A waveguide is coupled to the microwave cavity for guiding the microwave energy into the plasma discharge tube such that the plasma is generated in the plasma discharge tube. A rotational coupling device couples the waveguide to the plasma discharge tube and allows the waveguide to be rotated with respect to the plasma discharge tube to adjust an angle between the electric field of the microwave energy and the longitudinal axis of the plasma discharge tube, such that power absorption in the plasma discharge tube is adjustable via the rotational coupling device to a predetermined profile with respect to the longitudinal axis of the plasma discharge tube.

In some exemplary embodiments, the waveguide comprises a major cross-sectional axis and a minor cross-sectional axis, the rotational coupling device allowing the major and minor cross-sectional axes to be adjusted with respect to the longitudinal axis of the plasma discharge tube to adjust the angle between the electric field of the microwave energy and the longitudinal axis of the plasma discharge tube.

In some exemplary embodiments, the apparatus further comprises a controller for adjusting the angle between the electric field of the microwave energy and the longitudinal axis of the plasma discharge tube. The apparatus can include at least one of an electromagnetic field sensor for generating a first signal indicative of electromagnetic field intensity in the plasma discharge tube and a temperature sensor for generating a second signal indicative of temperature in the plasma discharge tube, and the controller controls the angle between the electric field of the microwave energy and the longitudinal axis of the plasma discharge tube based on at least one of the first and second signals. The apparatus can include at least one actuator for rotating the waveguide with respect to the plasma discharge tube to adjust the angle between the electric field of the microwave energy and the longitudinal axis of the plasma discharge tube, the controller controlling the at least one actuator to control the angle between the electric field of the microwave energy and the longitudinal axis of the plasma discharge tube.

In some exemplary embodiments, the angle between the electric field of the microwave energy and the longitudinal axis of the plasma discharge tube is adjustable from 30° to 90°. In some exemplary embodiments, the angle between the electric field of the microwave energy and the longitudinal axis of the plasma discharge tube is adjustable from 45° to 90°. In some exemplary embodiments, the angle between the electric field of the microwave energy and the longitudinal axis of the plasma discharge tube is adjusted to increase uniformity of power absorption with respect to the longitudinal axis of the plasma discharge tube.

In some exemplary embodiments, the apparatus further comprises a sensor for monitoring axial uniformity of the plasma in the plasma discharge tube.

In some exemplary embodiments, the conductive coil comprises a plurality of loops around the plasma discharge tube, the plurality of loops defining a pattern of spacing between adjacent loops, the pattern of spacing being selectable based on a predetermined desired effect of the current induced in the conductive coil on the power absorption in the plasma discharge tube. In some exemplary embodiments, the pattern of spacing between adjacent loops is selected to increase uniformity of power absorption with respect to the longitudinal axis of the plasma discharge tube. In some exemplary embodiments, the spacing between selected adjacent loops can be decreased to increase the electric current induced in the conductive coil such that propagation of microwave energy in the plasma discharge tube in proximity to the selected adjacent loops increases. In some exemplary embodiments, the spacing between selected adjacent loops can be increased to decrease the electric current induced in the conductive coil such that propagation of microwave energy in the plasma discharge tube in proximity to the selected adjacent loops decreases.

In some exemplary embodiments, the conductive coil is thermally coupled to the plasma discharge tube, and the conductive coil comprises a channel through which a cooling fluid can flow, such that the cooling fluid removes heat from the plasma discharge tube. The spacing between adjacent loops can be selected to minimize the temperature of the plasma discharge tube while ensuring propagation of the microwave fields.

In some exemplary embodiments, the apparatus further comprises a microwave choke at each of two ends of the conductive coil, the microwave chokes substantially preventing leakage of the microwave energy from the plasma discharge tube.

In some exemplary embodiments, the conductive coil is helically wound around the outer surface of the plasma discharge tube.

According to another aspect, a plasma discharge tube assembly for a plasma generating device is provided. The assembly includes a plasma discharge tube being substantially transparent to microwave energy and having a longitudinal axis. A conductive coil comprising an electrically conductive material is substantially helically wound around an outer surface of the plasma discharge tube. An electric field of the microwave energy induces an electric current in the conductive coil, the electric current affecting power absorption in the plasma discharge tube. A plurality of microwave chokes is disposed at each of two ends of the conductive coil, the microwave chokes substantially preventing leakage of the microwave energy from the plasma discharge tube.

In some exemplary embodiments, the conductive coil comprises a plurality of loops around the plasma discharge tube, the plurality of loops defining a pattern of spacing between adjacent loops, the pattern of spacing being selectable based on a predetermined desired effect of the current induced in the conductive coil on the power absorption in the plasma discharge tube. In some exemplary embodiments, the pattern of spacing between adjacent loops is selected to increase uniformity of power absorption with respect to the longitudinal axis of the plasma discharge tube. In some exemplary embodiments, the spacing between selected adjacent loops can be decreased to increase the electric current induced in the conductive coil such that propagation of microwave energy in the plasma discharge tube in proximity to the selected adjacent loops increases. In some exemplary embodiments, the spacing between selected adjacent loops can be increased to decrease the electric current induced in the conductive coil such that propagation of microwave energy in the plasma discharge tube in proximity to the selected adjacent loops decreases. In some exemplary embodiments, the spacing between adjacent loops is between 0.2 and 1 cm.

In some exemplary embodiments, the conductive coil is thermally coupled to the plasma discharge tube, and the conductive coil comprises a channel through which a cooling fluid can flow, such that the cooling fluid removes heat from the plasma discharge tube.

BRIEF DESCRIPTION OF THE DRAWINGS

The foregoing and other features and advantages will be apparent from the more particular description of preferred embodiments, as illustrated in the accompanying drawings, in which like reference characters refer to the same parts throughout the different views. The drawings are not necessarily to scale, emphasis instead being placed upon illustrating the principles of the inventive concept.

DETAILED DESCRIPTION

Figure 1:
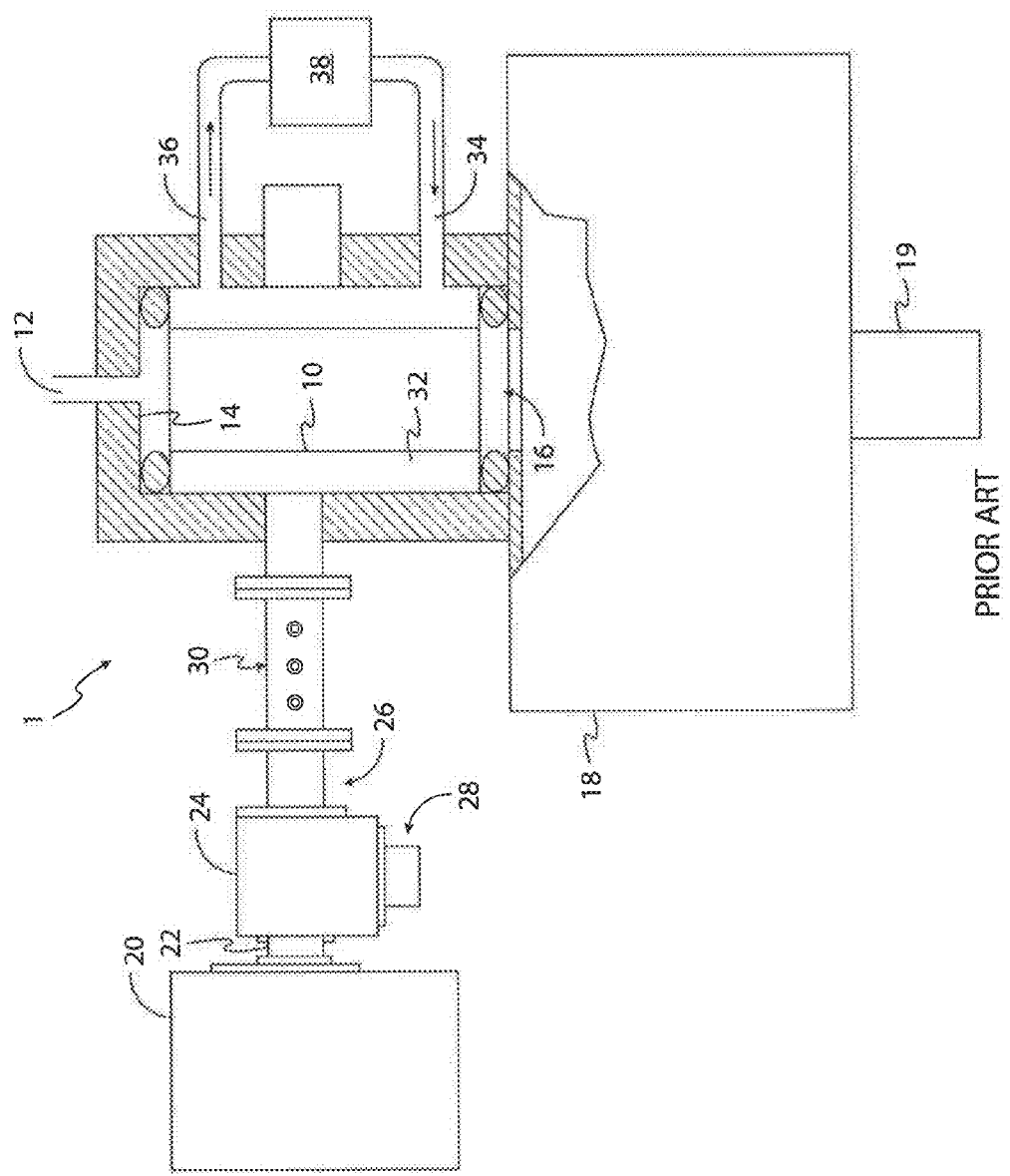
FIG. 1 includes a schematic cross-sectional view of a liquid-cooled microwave plasma applicator.

U.S. Pat. No. 5,625,259 (hereinafter, "the '259 patent"), incorporated herein in its entirety by reference, discloses that a microwave electric field oriented in a particular direction can be efficiently coupled to a microwave plasma discharge tube having a channel containing a microwave absorbing cooling liquid surrounding the plasma discharge tube in a certain path. For example, a microwave electric field oriented parallel to a longitudinal axis extending through the center of the plasma discharge tube will efficiently couple to the plasma discharge tube having a cooling channel encircling the tube in a helical path.

Furthermore, a microwave electric field oriented in a particular direction can be efficiently coupled to a dielectric window having one or more channels in contact with the window and containing a microwave absorbing cooling liquid. For example, a microwave electric field oriented parallel to the surface of the window will efficiently couple to a plasma discharge tube having one or more cooling channels encircling the plasma discharge tube in a helical path.

The '259 patent describes a fluid-cooled plasma applicator for microwave absorbing fluids, which includes a plasma discharge tube formed from a material substantially transparent to microwave energy such as quartz, sapphire, or alumina. Plasma discharge tubes formed from sapphire are desirable for applications using fluorine-based gasses. A cooling member surrounds the plasma discharge tube and defines a channel formed along an inner surface of the member and encircles an outer surface of the plasma discharge tube. The outer surface of the cooling member can be thermally bonded to the plasma discharge tube. The channel provides a conduit for transporting a microwave absorbing cooling fluid over the outer surface of the plasma discharge tube. A medium adjacent to the channel allows a microwave electric field to enter the plasma discharge tube and thus create and sustain a plasma in the plasma discharge tube while the fluid is flowing through the channel. The medium may be air.

The channel encircles the outer surface of the plasma discharge tube in a helical path. A microwave electric field oriented parallel to a longitudinal axis extending through the center of the plasma discharge tube enters the plasma discharge tube without being significantly attenuated by the fluid and thus allows a plasma to form and be sustained. The cooling member may be formed from polytetrafluoroethylene, which is chemically inert and microwave transparent, or from high-thermal conductivity material, which can be microwave transparent or reflecting. The channel within the cooling member is connectable to a pump which forces the fluid over the outer surface of the plasma discharge tube. The fluid may be water which has high thermal conductivity and is convenient to use.

The '259 patent also describes a microwave or plasma system which includes a source of microwave energy, a plasma discharge tube substantially transparent to microwave energy and coupled to the source, and a cooling jacket circumferentially positioned with respect to the plasma discharge tube and substantially transparent to microwave energy. The jacket defines a channel formed along an inner surface of the jacket in a helical path for transporting a fluid such as water over the outer surface of the plasma discharge tube. A medium adjacent to the channel allows a microwave electric field oriented parallel to a longitudinal axis extending through the center of the plasma discharge tube to enter the plasma discharge tube and sustain a plasma while the water is flowing through the channel. The system also includes a pump connected to a source of water and the channel which recirculates the water through the channel.

The '259 patent also describes a fluid-cooled dielectric window for use in a microwave plasma system. A cooling member is in contact with an outer surface of the dielectric window. The window is formed of a material substantially transparent to microwave energy such as quartz, sapphire, or alumina. The cooling member defines a channel for transporting the microwave absorbing cooling fluid such as water over the outer surface of the window and a medium adjacent to the channel. The medium, which can be air, allows a microwave electric field to enter through the window and sustain a plasma in the chamber while the fluid is flowing through the channel.

The channel can form a spiral path over the outer surface of the window. An electric field oriented parallel to the surface of the window enters the window without being significantly attenuated by the fluid and thus allows a plasma to form and be sustained. The cooling member may be formed from polytetrafluoroethylene, which is chemically inert and microwave transparent, or from high-thermal conductivity material, which can be microwave transparent or reflecting. The channel within the member is connectable to a pump which forces the fluid over the outer surface of the plasma discharge tube.

FIG. 1 includes a schematic cross-sectional view of a prior art liquid-cooled microwave plasma applicator 1. The applicator 1 includes a dielectric plasma discharge tube 10. The plasma discharge tube 10 is made of a material which is substantially transparent to microwave energy and which has suitable mechanical, thermal, and chemical properties for plasma processing. Typical materials include quartz, sapphire, and alumina. A gas inlet 12 positioned at a top 14 of the plasma discharge tube 10 allows process gasses to be introduced into the plasma discharge tube 10. A bottom 16 of the plasma discharge tube 10 is coupled to a vacuum chamber 18. A vacuum pump 19 is used to evacuate the chamber 18. During processing, reactive gas species generated in the plasma discharge tube 10 flow downstream into the chamber 18.

A magnetron 20 generates the microwave energy required to create and sustain a plasma in the plasma discharge tube 10. An output 22 of the magnetron 20 is coupled to a circulator 24, which allows the microwave energy to pass unrestricted to a waveguide 26, which is coupled to the plasma discharge tube 10 to transport the energy to the plasma discharge tube 10. The circulator 24 directs the microwave energy reflected by the plasma discharge tube 10 to a dummy load 28 so as not to damage the magnetron 20. A tuner 30 minimizes the reflected energy by perturbing the electromagnetic field in the waveguide 26.

A cooling jacket 32 with an inlet 34 and an outlet 36 surrounds the plasma discharge tube 10. A pump 38 coupled to the jacket 32 forces cooling liquid into the inlet 34, through the jacket 32, and through the outlet 36 back to the pump 38. The liquid directly contacts the entire outer surface of the plasma discharge tube 10. Thus, the microwave energy in the waveguide 26 must travel through the liquid to reach the plasma discharge tube 10. If the liquid significantly absorbs microwave energy, the energy in the waveguide 26 does not sufficiently couple to the plasma discharge tube 10 to form and sustain a plasma.

Thus, in this configuration, only liquids which do not significantly absorb microwave energy are used in the liquid-cooled microwave plasma applicator 1. Examples of such liquids include silicone oils, certain chlorofluorocarbons, and various hydrocarbon compounds. Unfortunately, such fluids are both environmentally undesirable and expensive. Many such fluids are also hazardous to workers and require complex handling procedures. In addition, most of these liquids require the use of closed-loop heat exchangers which significantly increase the system cost and complexity. Furthermore, if the plasma discharge tube 10 were to rupture, these fluids would contaminate the processing equipment.

Figure 2:
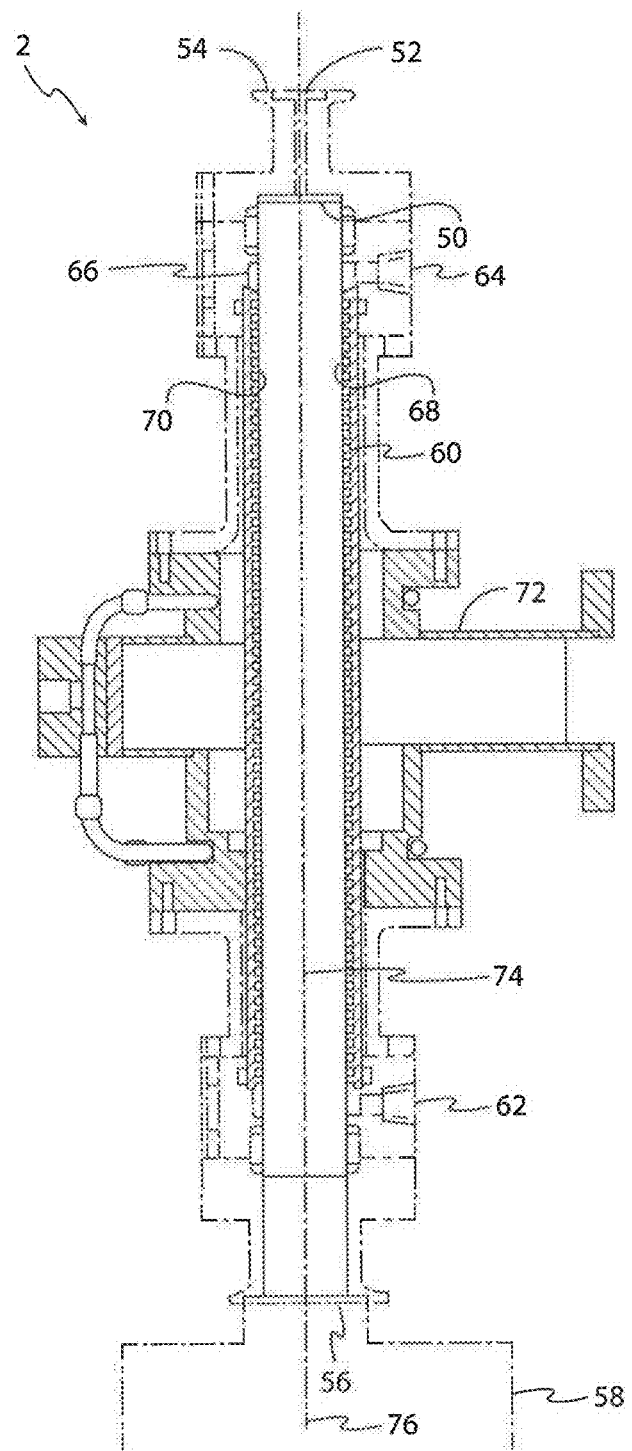
FIG. 2 includes a schematic cross-sectional view of a liquid-cooled microwave plasma applicator, which can use microwave-absorbing fluids.

FIG. 2 includes a schematic cross-sectional view of a prior art liquid-cooled microwave plasma applicator 2, which can use microwave-absorbing fluids. The applicator 2 of FIG. 2 includes a dielectric plasma discharge tube 50 which can be made of a material that is substantially transparent to microwave energy and which has suitable mechanical, thermal, and chemical properties for plasma processing. Such materials include quartz, sapphire and alumina. A gas inlet 52 positioned at a top 54 of the plasma discharge tube 50 allows process gasses to be introduced into the plasma discharge tube 50. A bottom 56 of the plasma discharge tube 50 is coupled to a vacuum chamber 58. Reactive gas species generated in the plasma discharge tube 50 flow downstream into the chamber 58.

A cooling jacket 60 with an inlet 62 and an outlet 64 surrounds an outer surface 66 of the plasma discharge tube 50. The jacket 60 is formed of a material which is substantially transparent to microwave energy, such as, for example, polytetrafluoroethylene. The jacket 60 includes a channel 68 formed along an inner surface 70 of the jacket 60 that encircles the outer surface of the plasma discharge tube 50. The channel 68 provides a conduit for transporting a microwave absorbing cooling fluid directly over the outer surface of the plasma discharge tube 50. The fluid can be water.

The channel 68 forces the cooling fluid to take a particular path around the outer surface of the plasma discharge tube 50. The path is chosen to maximize the area of the plasma discharge tube 50 exposed to the cooling fluid. The path, however, leaves sufficient space to allow a microwave electric field with a certain orientation to enter the plasma discharge tube and form and sustain the plasma discharge. In some exemplary embodiments, the channel encircles the outer surface of the plasma discharge tube 50 in a helical path leaving a small separation between the loops of the path.

A waveguide 72 carries the microwave energy necessary to create and sustain a plasma in the plasma discharge tube 50 from the magnetron (not shown in FIG. 2) to the plasma discharge tube 50. In some particular exemplary embodiments, the microwave electric field is oriented parallel to a longitudinal axis 74 extending through a center 76 of the plasma discharge tube 50. This orientation allows microwave energy to readily penetrate the plasma discharge tube 50 between the loops of the helical channel 68 without being significantly attenuated by the fluid and thus will allow a plasma to form and be sustained.

Although microwave energy is specified as the source for creating the plasma discharge, it is noted that this disclosure applies to the use of radio frequency (RF) energy sources. Also, although the use of microwave absorbing cooling liquids is specified, it is noted that systems incorporating the invention can utilize non-absorbing cooling liquids.

Figure 3:
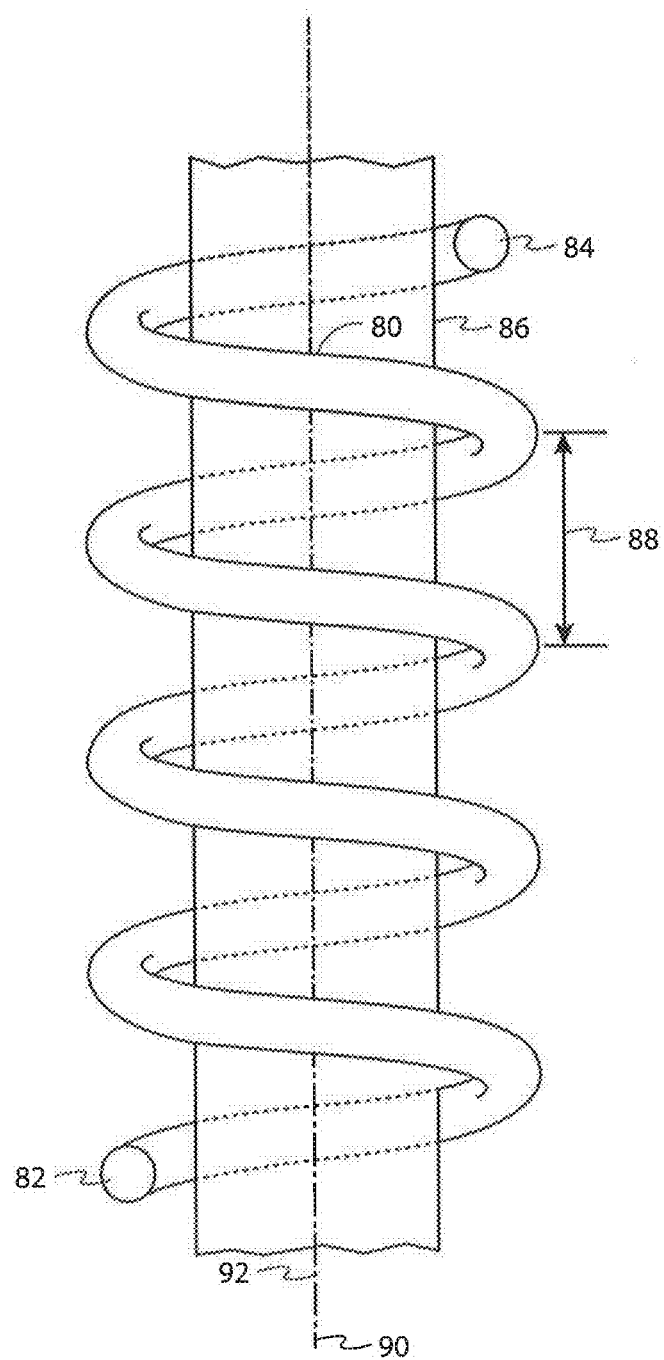
FIG. 3 includes a schematic cross-sectional diagram of an embodiment of the cooling jacket illustrated in FIG. 2.

FIG. 3 includes a schematic cross-sectional diagram of an exemplary embodiment of the cooling jacket illustrated in FIG. 2. Referring to FIG. 3, a cooling tube 80 with an inlet 82 and an outlet 84 is wrapped around the plasma discharge tube 86. The cooling tube 80 preferably encircles the outer surface of the plasma discharge tube 86 in a helical path leaving a small separation 88 between the loops of the path. In some particular exemplary embodiments, the microwave electric field is oriented parallel to a longitudinal axis 90 extending through a center 92 of the plasma discharge tube 86. This orientation allows microwave energy to readily penetrate the plasma discharge tube 86 between the loops of the helical channel without being significantly attenuated by the fluid and thus allows a plasma to form and be sustained. The cooling tube 80 can be either metallic or non-metallic and can be thermally bonded to the outer surface of the plasma discharge tube 86.

It is desirable that a plasma applicator such as those described above in connection with FIGS. 1-3 adequately produce high-flow-rate, contamination-free, chemically-activated gases needed for industrial applications. As described above, the microwave plasma applicator 2 illustrated in FIG. 2 includes a microwave cavity and a dielectric plasma discharge tube 50 with a helical cooling coil 80. The direction of the microwave electric field in the waveguide 72 is oriented in parallel with the longitudinal axis 74 of the plasma discharge tube 50. Because the loops of the helical cooling coil 80 are nearly perpendicular to the longitudinal axis of the plasma discharge tube 50, the electric field orientation allows microwave energy to penetrate readily into the plasma discharge tube 50 between the turns or loops of the helical coil 80.

Figure 4A:
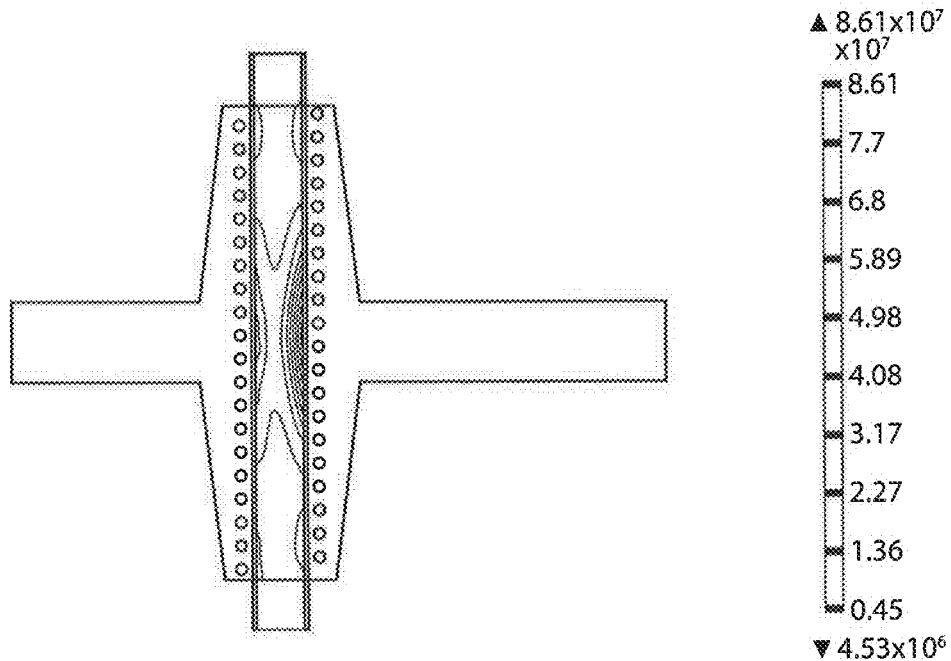
FIGS. 4A and 4B include schematic power absorption profiles for the plasma applicator 2 illustrated in FIG. 2.
Figure 4B:
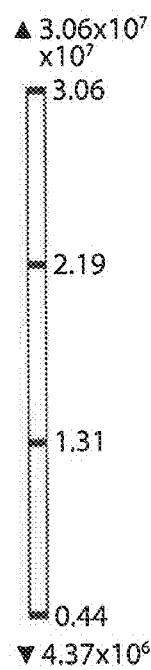

In the device of FIG. 2, microwave power absorption is highly localized. FIGS. 4A and 4B include schematic power absorption profiles for the plasma applicator 2 illustrated in FIG. 2. Specifically, FIG. 4A includes a power absorption profile for the plasma applicator 2 of FIG. 2 viewing in the direction perpendicular to the waveguide 72. FIG. 4B includes a power absorption profile for the plasma applicator 2 of FIG. 2 viewing in the direction along the waveguide 72. As can be seen from FIGS. 4A and 4B, the power absorption profile in the plasma discharge tube 50 is concentrated in the region facing the microwave inlet to the plasma discharge tube 50. The high peak power density causes excessive erosion of the plasma channel by the reactive gases and plasmas. Moreover, the peak heat flux near the waveguide inlet is high, which creates strong thermal-mechanical stresses that can cause the dielectric plasma discharge tube 50 to break. As a result, the maximum operating power of this type of plasma applicator 2 is limited to about 3 kW.

Inductively-coupled and capacitively-coupled plasma devices can be used for generating activated gases, but they also suffer severe limitations. Capacitively-coupled plasmas are energy inefficient in generating reactive gases. As electric currents terminate at the discharge electrodes, a significant fraction of energy is lost in the electrodes, thus reducing energy available for gas excitation. In addition, high-energy electrons and ions are generated at electrode surfaces, resulting in increased erosion of the plasma source surface. This leads to high chemical and particle contamination and reduces product life.

Inductively-coupled plasmas can have higher energy efficiencies compared with capacitively-coupled discharges. However, it is difficult to completely eliminate capacitive coupling in an inductively-coupled plasma device. To achieve high magnetic coupling efficiency, magnetic cores may be used in an inductive plasma device, such as, for example, in a toroidal plasma generator of the type disclosed in U.S. Pat. No. 6,150,628, the entire contents of which are incorporated herein by reference. The use of toroidal geometry limits the selection of materials that can be used to form the plasma chamber. Metals, coated metals or ceramics, such as aluminum, anodized aluminum or alumina ceramic are used to form toroidal plasma chambers. However, it is difficult to use single-crystal materials such as sapphire to form the plasma chamber. This has limited the use of inductive plasma sources in applications where low chemical and particle contamination is needed.

According to some exemplary embodiments, a microwave plasma applicator having improved uniformity of power deposition, higher power capability, and lower contamination as compared to prior microwave plasma applicators is provided. The applicator of the exemplary embodiments includes a microwave cavity and a dielectric plasma discharge tube surrounded by an electrically conductive cooling coil. In some particular exemplary embodiments, the conductive cooling coil can be helically wound on the exterior of the plasma discharge tube. The direction of the microwave electric field in the waveguide is angled at between 30° and 90°, and preferably between 45° and 90°, relative to the longitudinal axis of the plasma discharge tube. By having a component of the electric field in parallel with the loops of the conductive coil, an electric current is induced in the conductive cooling coil. The electric current flows along the conductive cooling coil, which causes microwave energy to propagate longitudinally and azimuthally around the dielectric plasma discharge tube, thus making microwave power more uniformly absorbed in the plasma.

Figure 5A:
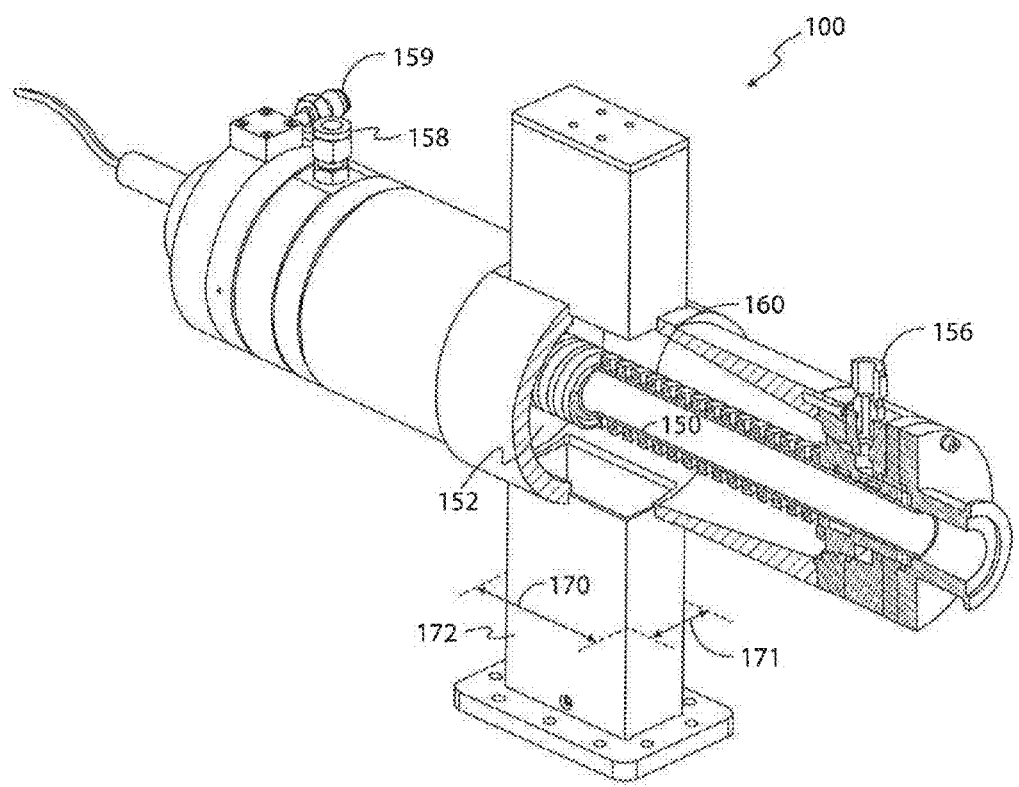
FIGS. 5A through 5D include schematic diagrams which illustrate a plasma applicator, according to some exemplary embodiments.
Figure 5B:
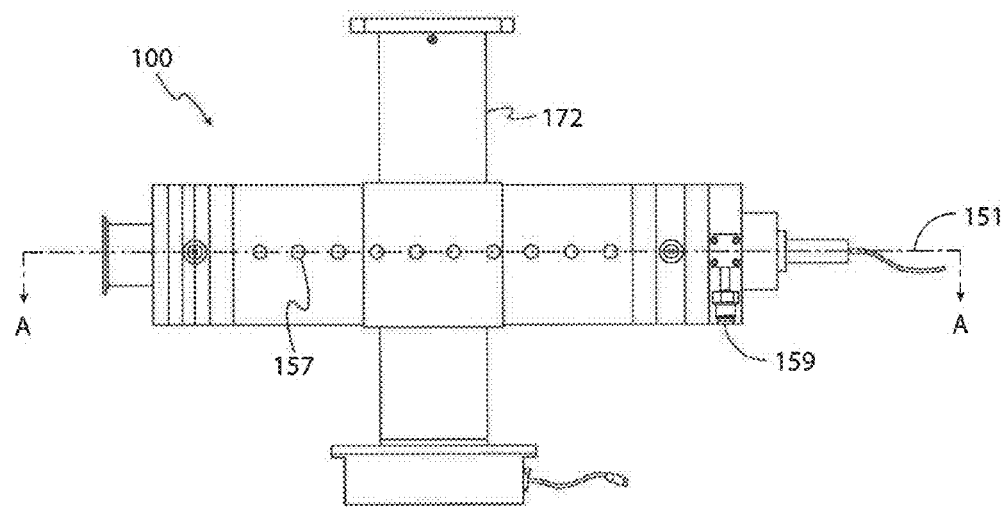
Figure 5C:
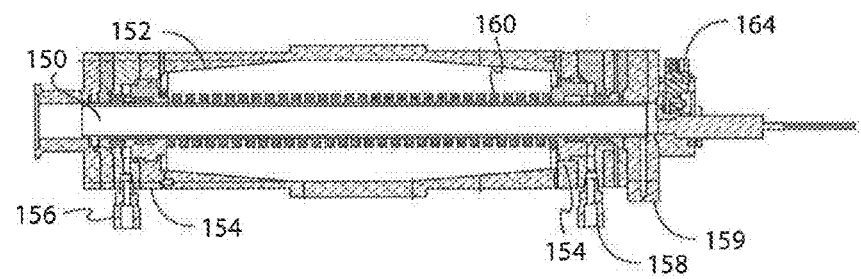
Figure 5D:
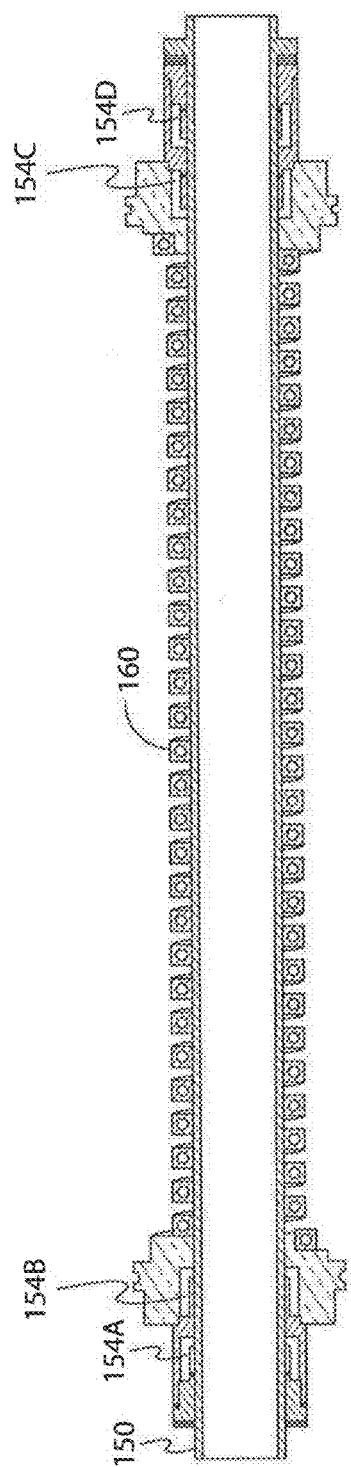

FIGS. 5A through 5D include schematic diagrams which illustrate a plasma applicator 100, according to some exemplary embodiments. Specifically, FIG. 5A includes a schematic perspective, partially cut-away view of the plasma applicator 100, according to exemplary embodiments; FIG. 5B includes a schematic side view of the plasma applicator 100, according to exemplary embodiments; and FIG. 5C includes a schematic cross-sectional view of the plasma applicator 100, taken along line A-A of FIG. 5B, according to exemplary embodiments. FIG. 5D includes a schematic detailed cross-sectional view of the plasma discharge tube with surrounding conductive helical cooling coil, according to some exemplary embodiments.

In the embodiment of the plasma applicator 100 illustrated in FIGS. 5A through 5C, the waveguide 172 is oriented such that the direction of the electric field is 90° from the longitudinal axis of the dielectric plasma discharge tube 150. In some exemplary embodiments, the waveguide 172 has a rectangular cross-section, with a wider side which defines a major cross-sectional axis 170 of the waveguide 172 and a narrower side which defines a minor cross-sectional axis 171 of the waveguide 172. The waveguide 172 is oriented such that the major cross-sectional axis 170 of the waveguide 172 is in parallel with the longitudinal axis 151 of the plasma discharge tube 150. In its fundamental mode, the microwave electric field in the waveguide 172 is primarily in parallel with the minor cross-sectional axis 171 of the waveguide 172 (see FIG. 12B). Microwave energy is coupled or guided to the cavity 152 through the waveguide 172. The dielectric plasma discharge tube 150, which is surrounded by a conductive cooling coil 160, is located at the center of the cavity 152. The conductive cooling coil 160 is thermally bonded to the plasma discharge tube 150 to remove heat from the plasma discharge tube 150. In some exemplary embodiments, the conductive cooling coil can be helically wound around the exterior of the plasma discharge tube 150, as illustrated in the exemplary embodiment of FIGS. 5A-5D. The spacing between adjacent loops can be selected to control temperature of the plasma discharge tube. The spacing between adjacent loops can be selected to minimize the temperature of the plasma discharge tube while ensuring propagation of the microwave fields.

In some embodiments, the spacing between adjacent loops of the conductive cooling coil can be adjustable on the plasma discharge tube so that it can be adjusted according to plasma impedance and/or the level of microwave power. To that end, in some embodiments, the conductive cooling coil can be made of flexible metal tubing. Dielectric forms or spacers can be placed on the conductive cooling coil to set the spacing between adjacent loops. The flexible tubing can be made of a soft metal such as copper, or can have an elastic structure similar to a bellow, or can have a flexible mechanism similar to those used in gooseneck tubing. The spacing can be adjusted, for example, to improve the uniformity of power deposition in the plasma discharge tube. In general, in some embodiments, the spacing between adjacent loops of the conductive cooling coil can be adjusted to obtain any desired power profile in the plasma discharge tube.

With the helical turns or loops of the conductive cooling coil 160 nearly in parallel with the electric fields in the waveguide 172, an electric current is induced in the conductive cooling coil 160. The current flows along the conductive helical cooling coil 160, helping to propagate microwave energy along the longitudinal axis 151 of the plasma discharge tube 150. Other waveguide shapes, such as circular or oval waveguide can also be used according to the exemplary embodiments.

In one exemplary embodiment, the conductive cooling coil 160 can be made from a copper tube with a cooling fluid flowing inside the copper tube. The use of a square or rectangular cross-section cooling tube is advantageous in providing a larger contact area between the dielectric plasma tube 150 and the cooling coil 160, thereby improving thermal conductance from the dielectric plasma tube 150 to the cooling coil 160. The cooling fluid can be any of the cooling fluids described above. In some exemplary embodiments, the cooling fluid is water. In some exemplary embodiments, microwave chokes 154, specifically labeled as 154A, 154B, 154C and 154D in FIG. 5D, are located at the ends of the cooling structure to prevent leakage of microwave energy from the microwave cavity 152. The cooling structure can include a fluid inlet 156 by which the cooling fluid, e.g., water, enters the cooling coil 160 and a fluid outlet 158 by which the cooling fluid exits the cooling coil 160. Gas enters the dielectric plasma tube 150 through a gas inlet 159. According to some exemplary embodiments, a temperature sensor 157 is used to monitor the temperature profile of the exterior of the plasma discharge tube 150. The temperature sensor 157 can be an array of infrared thermal sensors, positioned on the microwave cavity 152 and along the longitudinal axis 151, for monitoring temperature and temperature profile of the exterior of the plasma discharge tube 150. The temperature signal is transmitted to a control system and is used for protection of the plasma discharge tube 150 and for optimization of processes. An optical sensor 164 can be installed on the microwave cavity 152 for monitoring light emissions from the plasma. The optical sensor is activated when a plasma is ignited in the dielectric plasma tube 150. The signal indicates the formation of plasma after microwave power turn-on, and it can be used for controlling subsequent process parameters. Optionally, a pressure sensor (not shown) can be connected fluidly to the dielectric plasma tube 150 to monitor the gas pressure in the dielectric plasma tube during a process.

Figure 6:
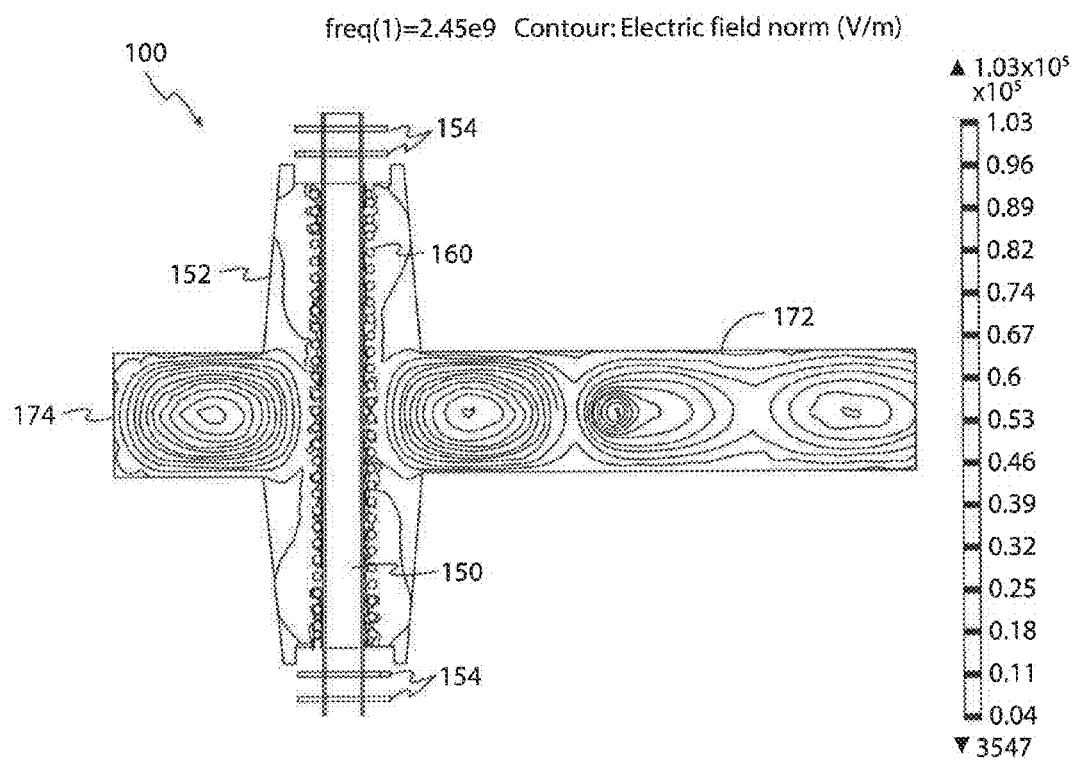
FIG. 6 includes a schematic cross-sectional diagram of the plasma applicator of FIGS. 5A through 5D, which illustrates electric field distribution in the plasma applicator, according to some exemplary embodiments.

FIG. 6 includes a schematic cross-sectional diagram of the plasma applicator 100, which illustrates electric field distribution in the plasma applicator 100. The back wall 174 of the waveguide 172, which is illustrated in FIG. 6 on the left side of the cavity 152, is selected to be approximately half of a wavelength ($\lambda/2$) from the outer radius of the conductive helical cooling coil 160, inducing a maximum electric current in the conductive helical cooling coil 160 while maintaining the intensities of the electric field symmetric on the two sides of the plasma discharge tube 150. In accordance with some exemplary embodiments, the diameter of the dielectric plasma discharge tube 150 can be between 1 and 10 cm, and the length of the plasma discharge tube 150 can be between 10 and 100 cm.

Figure 7A:
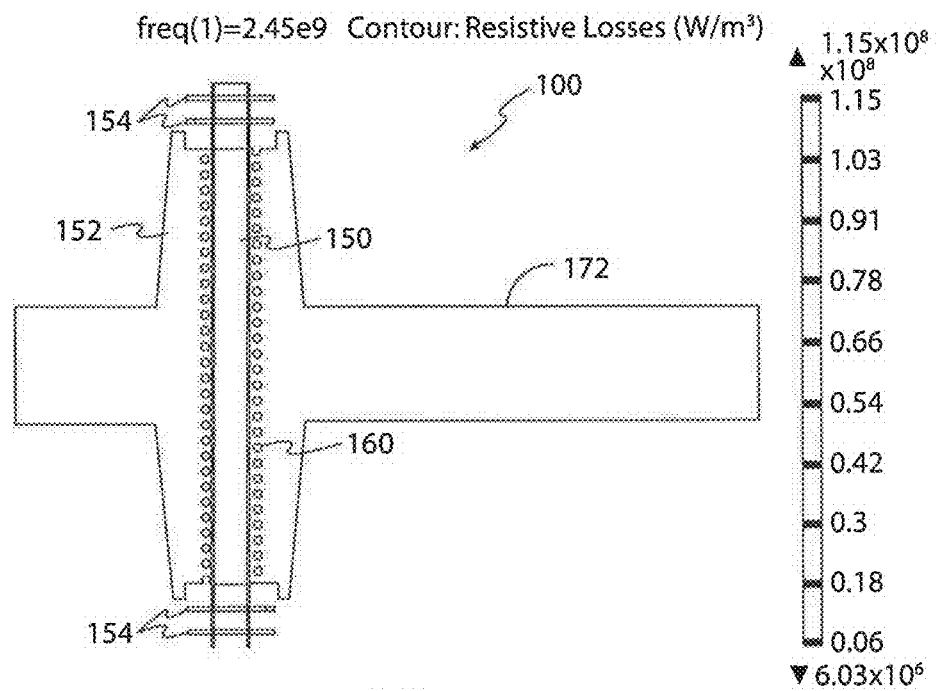
FIGS. 7A and 7B include schematic cross-sectional diagrams of the plasma applicator of FIGS. 5A through 5D, which illustrate simulated power absorption profiles in the plasma applicator, according to some exemplary embodiments.
Figure 7B:
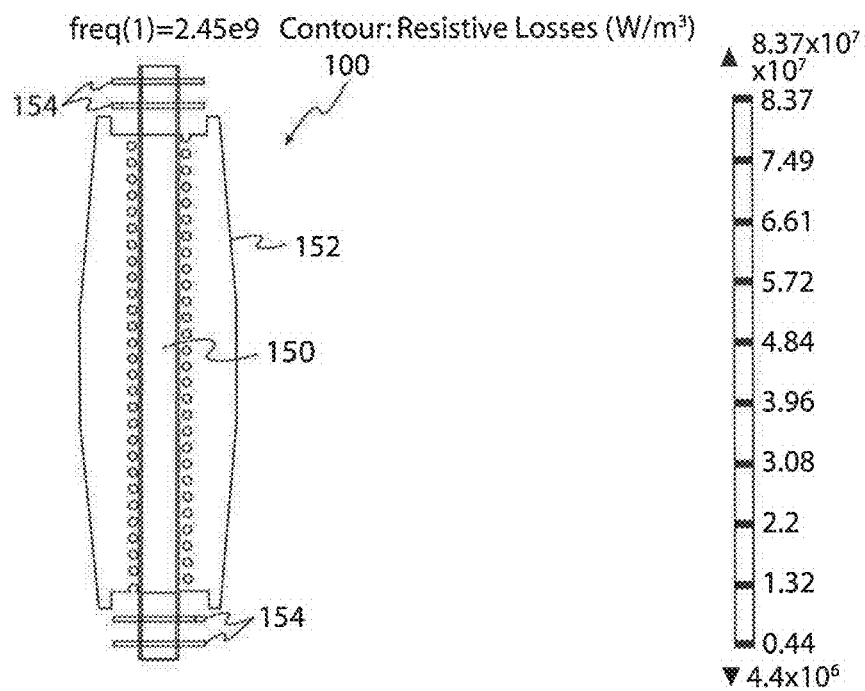

FIGS. 7A and 7B include schematic cross-sectional diagrams of the plasma applicator 100, which illustrate simulated power absorption profiles in the plasma applicator 100, according to some exemplary embodiments. FIG. 7A is oriented viewing in the direction perpendicular to the waveguide 172, and FIG. 7B is oriented viewing in the direction along the waveguide 172. The simulated power absorption profiles of FIGS. 7A and 7B correspond to the electric field distribution illustrated in FIG. 6. FIGS. 7A and 7B illustrate that, according to exemplary embodiments, microwave power is absorbed over the entire length of the plasma discharge tube 150, with some wave structures due to finite wavelength of the microwave.

The power absorption profile illustrated in FIGS. 7A and 7B illustrates that the absorption of microwave power extends to the entire length of the plasma discharge tube 150. The power coupling between the microwave current flowing in the conductive helical cooling coil 160 and the plasma is relatively weak. Microwave energy may propagate up to 50-100 cm in the longitudinal direction of the plasma discharge tube 150. The power absorption has a wavy structure along the longitudinal axis of the plasma discharge tube 150 due to the finite wavelength of the microwave. Since microwave energy is coupled from outside of the dielectric plasma discharge tube 150, power absorption also occurs at the outer radius of the plasma column. The power absorption profile of FIGS. 7A and 7B is significantly more uniform compared to that of the plasma applicator 2 of FIGS. 2, 4A and 4B.

As described above in detail and illustrated in FIGS. 5D, 6, 7A, and 7B, according to the exemplary embodiments, microwave chokes 154, specifically labeled as 154A, 154B, 154C and 154D in FIG. 5D, are located at the ends of the cooling structure to prevent leakage of microwave energy from the microwave cavity 152. A choke is a short-circuited stub line approximately one-quarter wavelength long. The opening of the choke 154 faces the plasma discharge tube. At a short-circuited end of each choke 154, the electric field is at minimum, while current is maximum. At one-quarter wavelength away, the electric field is maximum and current is minimum. A high impedance occurs at the choke opening facing the plasma discharge tube, preventing further propagation of microwave energy along the tube. According to the exemplary embodiments, a "double-choke" structure, in which two chokes are disposed at each end of the plasma discharge tube. The use of a double-choke structure according to the exemplary embodiments reduces the microwave electric field by two orders of magnitude (four orders of magnitude in power), in contrast with a single-choke structure in which the electric field may be reduced by a single order of magnitude. This reduction in microwave electric field and power at the end of the plasma discharge tube blocks or substantially reduces the amount of microwave electric field and power which escapes at the end of the tube. As a result, much higher power can be utilized within the plasma discharge tube. It should be noted that the chokes 154 illustrated in FIGS. 6, 7A and 7B are straight chokes, while chokes 154A, 154B, 154C and 154D illustrated in FIG. 5D are folded chokes. As long as their electrical lengths are the same, straight chokes and folded chokes have the same operational characteristics. The present disclosure is applicable to both folded chokes and straight chokes.

According to the exemplary embodiments, uniform power absorption is a benefit for a high-power plasma source, since maximum power capability of a device is often limited by the peak heat load. Improving power uniformity reduces peak heat flux and surface temperature, leading to lower thermo-mechanical stress on the plasma discharge tube. Microwave chokes 154 located at ends of the plasma applicator cavity 152 reflect and confine microwave energy within the applicator cavity 152. As a result, a wide range for selection of the length of the plasma applicator 100 is available. The plasma applicator 100 of the exemplary embodiments is therefore scalable to accommodate various power requirements and gas chemistries. In the particular exemplary embodiment of the plasma applicator 100 of FIGS. 5A through 5D, a microwave frequency of 2.54 GHz can be used. It will be understood that the present disclosure is applicable to microwave frequencies in the range 800 MHz through 30 GHz.

Figures 8A, 8B:
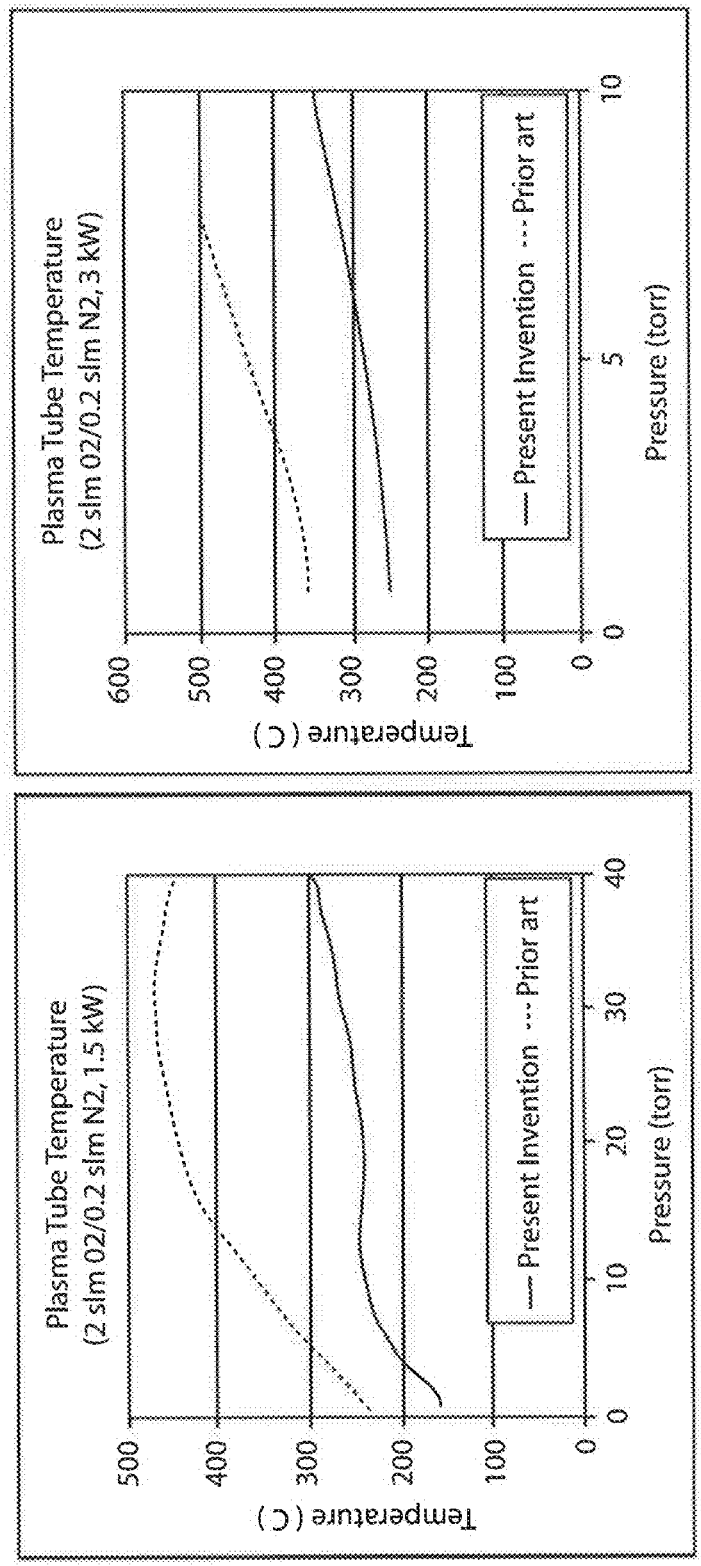
FIGS. 8A and 8B include plasma discharge tube temperature-pressure curves for a prior plasma applicator such as the plasma applicator illustrated in FIG. 2 and a plasma applicator of the exemplary embodiments, such as plasma applicator illustrated in FIGS. 5A through 5D, according to some exemplary embodiments.

FIGS. 8A and 8B include plasma discharge tube temperature-pressure curves for a prior art plasma applicator such as plasma applicator 2 illustrated in FIG. 3 and a plasma applicator of the exemplary embodiments, such as plasma applicator 100 illustrated in FIGS. 5A through 5D. In the graphs of FIGS. 8A and 8B, the dashed curves are for the prior applicator 2, and the solid curves are for the applicator 100 of the exemplary embodiments. For each of the operational experiments on which the two pairs of curves are based, the two plasma applicators being tested were of identical size and had identical cooling structures, and were operated under identical gas conditions. In the curves of FIG. 8A, both applicators were operated at a power of 1.5 kW, and, in the curves of FIG. 8B, both applicators were operated at a power of 3 kW. As illustrated in FIGS. 8A and 8B, the plasma applicator 100 of the exemplary embodiments, in which the electric field orientation is rotated 90° with respect to that of the prior plasma applicator 2, is 40-50% cooler than the prior art plasma applicator 2.

Figure 9:
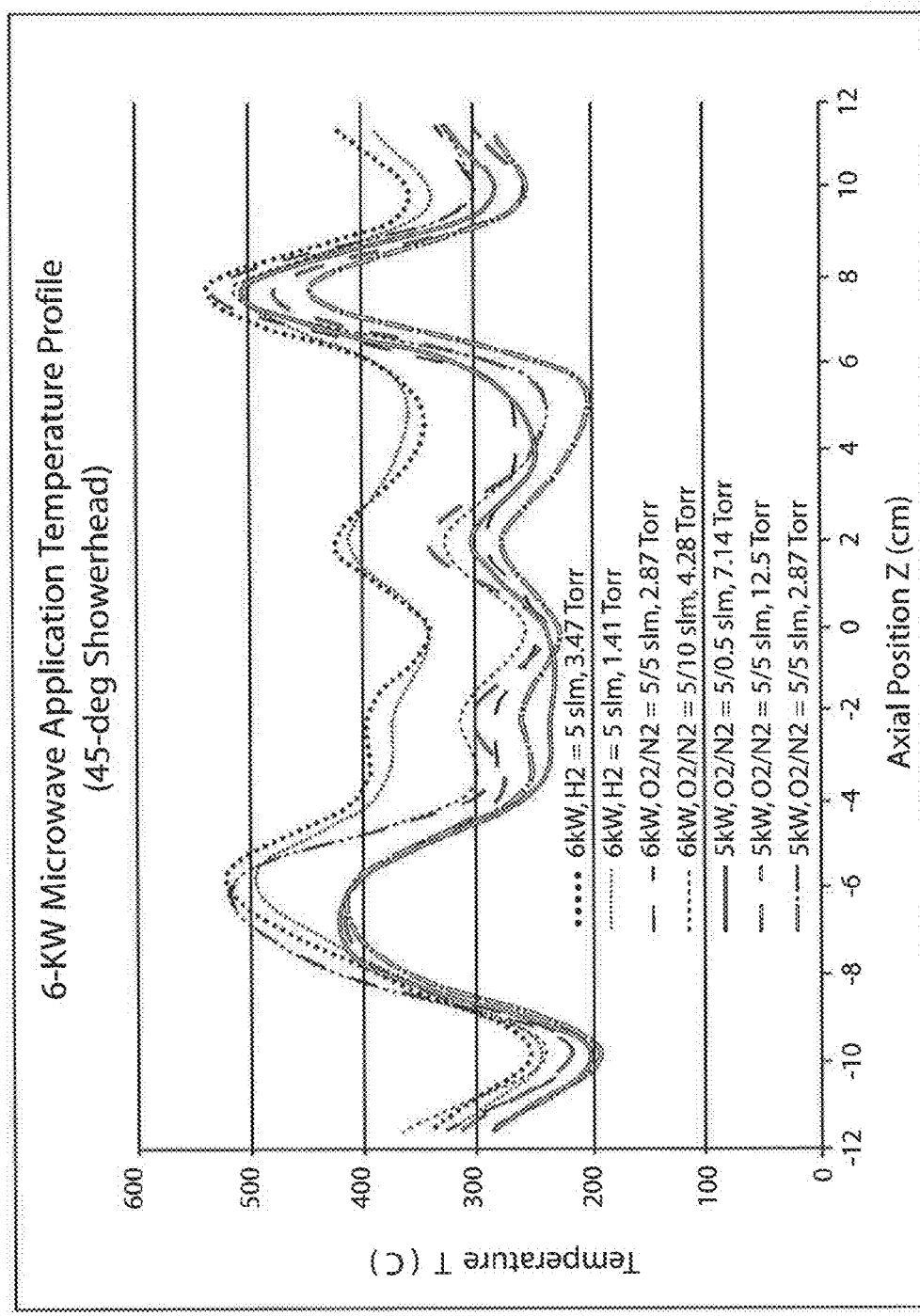
FIG. 9 is a graph of temperature versus axial position, which illustrates multiple longitudinal or axial operational temperature profiles for a plasma discharge tube in a plasma applicator, according to some exemplary embodiments.

FIG. 9 is a graph of temperature versus axial position, which illustrates multiple longitudinal or axial operational temperature profiles for a plasma discharge tube 150 in a plasma applicator 100, according to some exemplary embodiments. The multiple curves of FIG. 9 illustrate various temperature profiles under various gas flow and power conditions. The plasma applicator 100 operates at up to 6 kW of microwave power, which is approximately twice the maximum operating power of the prior plasma applicator 2, while the peak temperature of the plasma discharge tube 100 is below that of the prior plasma applicator 2. Since the length of the plasma applicator 100 is scalable, the power capability can be increased, if necessary.

According to some exemplary embodiments, to further improve the uniformity of power deposition in the plasma, the pitch angle of the conductive helical cooling coil 160 can be varied along the longitudinal axis of the plasma discharge tube 150. That is, the spacing between loops in the conductive helical cooling coil 150 can be varied to improve the uniformity of the power absorption profile and/or to obtain a desired power absorption profile.

The conductive helical cooling coil 160 on the plasma discharge tube 150 serves multiple functions, namely, propagating and coupling microwave energy to the plasma and providing cooling to the dielectric plasma discharge tube 150. As microwave power increases, thermal-mechanical stresses on the plasma discharge tube 150 increase. As described above, in the exemplary embodiments, to maximize the power capability of the plasma discharge tube 150, the conductive helical cooling coil 160 can be made of tubing, and a cooling fluid can flow inside the conductive helical cooling coil 160 to remove heat from the plasma discharge tube 150. A thermally conductive, conformal thermal bonding material, for example, a thermal silicone compound, may be used to bond the conductive helical cooling coil 160 to the dielectric plasma discharge tube 150. According to some exemplary embodiments, the spacing between adjacent loops of the conductive helical cooling coil 160 can be selected based on optimization of microwave propagation/coupling and thermal conduction requirements. When the spacing narrows, electric fields between adjacent loops increase, which can increase the current induced in the conductive helical cooling coil 160 and, therefore, the coupling and propagation of microwave energy to the plasma discharge tube 150 and along the longitudinal axis of the plasma discharge tube 150. However, narrowing of the space may also cause electric arcs at the conductive helical cooling coil 160. To mitigate this possibility, a dielectric material may be deposited to fill the spacing between the adjacent loops to raise the arcing threshold. In contrast, when the spacing between loops widens, thermal conductance from the dielectric plasma discharge tube 150 to the cooling fluid flowing inside the conductive helical cooling coil 160 is reduced, which can result in higher thermal-mechanical stress and sometimes higher plasma erosion on the dielectric plasma discharge tube 150. In some exemplary embodiments, the preferred spacing between loops of the conductive helical cooling coil 160 for a microwave plasma discharge tube 150 operating at 1-10 kW of power can be in the range of 0.2 to 1 cm.

Figure 10:
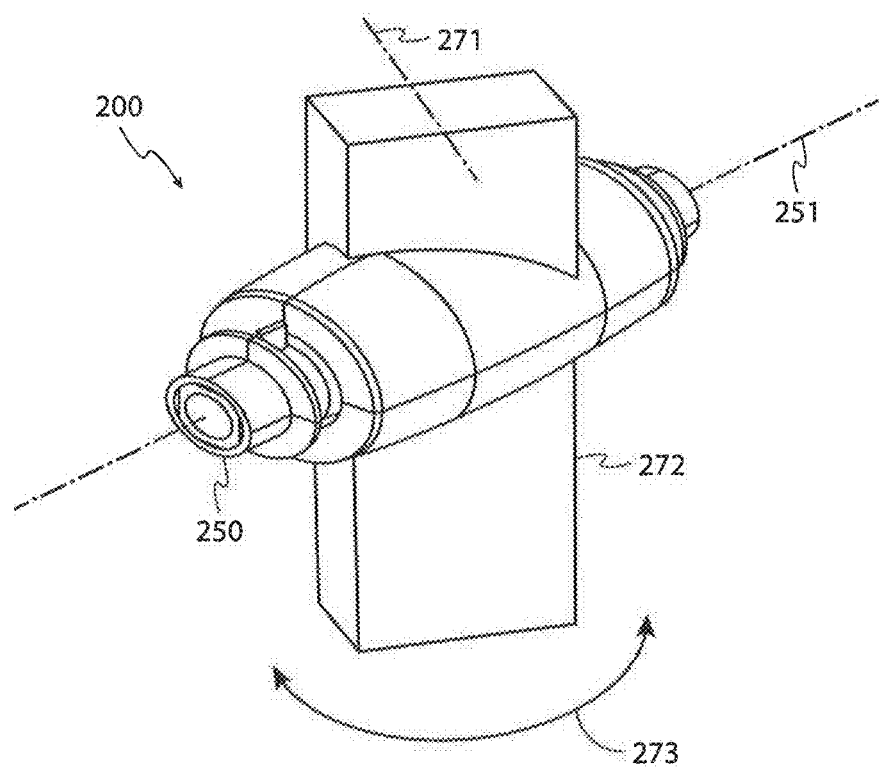
FIG. 10 includes a schematic perspective view of a plasma applicator, according to some exemplary embodiments.

FIG. 10 includes a schematic perspective view of a plasma applicator 200, according to another exemplary embodiment. The plasma applicator 200 of FIG. 10 is the same in many respects as the plasma applicator 100 of FIGS. 5A through 5D, with the primary exception being that, in the plasma applicator 200 of FIG. 10, waveguide 272 is rotated about its longitudinal axis with respect to plasma discharge tube 250, as indicated by arrow 273, such that the minor cross-sectional axis 271 of waveguide 272, and, therefore, the microwave electric field, forms a predetermined angle with respect to the longitudinal axis 251 of the plasma discharge tube 250. Except as indicated otherwise, the description above with respect to the plasma applicator 100 of FIGS. 5A through 5D applies to the plasma applicator 200 of FIG. 10.

Referring to FIG. 10, in this particular illustrative exemplary embodiment, the predetermined angle between the minor cross-sectional axis 271 of the waveguide 272 and the longitudinal axis 251 of the plasma discharge tube 250 is illustrated to be 60°, instead of the angle of 90° in the plasma applicator 100 of FIGS. 5A through 5D. The use of an acute angle between microwave electric field and the longitudinal axis 251 of the plasma discharge tube 250 is particularly useful for uniformly depositing microwave power in a relatively short plasma discharge tube 250. Also, like the plasma applicator 100, in the plasma applicator 200 of FIG. 10, the loops of the conductive helical cooling coil (not shown) are nearly perpendicular to the longitudinal axis of the plasma discharge tube 250. With the direction of the electric field angled from the loops of the conductive helical cooling coil, there exist both a perpendicular component and a parallel component of the electric field with respect to the loops of the conductive helical cooling coil. The perpendicular electric field, $E_\perp$, may penetrate the conductive helical cooling coil relatively easily and be absorbed locally. The parallel electric field, $E_\parallel$, induces an electric current in the conductive helical cooling coil, and helps to propagate microwave energy along the longitudinal axis of the plasma discharge tube 250. Adjusting the angle between the microwave electric field and the conductive helical cooling coil changes the relative strengths of $E_\perp$ and $E_\parallel$, allowing optimization of the power absorption profile in the plasma discharge tube 250.

Figure 11A:
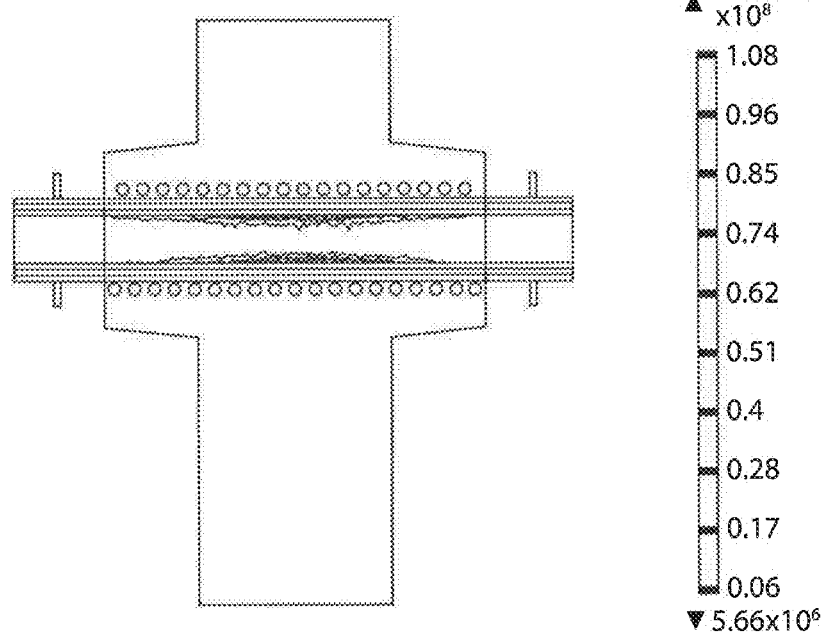
FIGS. 11A and 11B include schematic diagrams of an operational power absorption profile for the plasma applicator illustrated in FIG. 10, according to some exemplary embodiments.
Figure 11B:
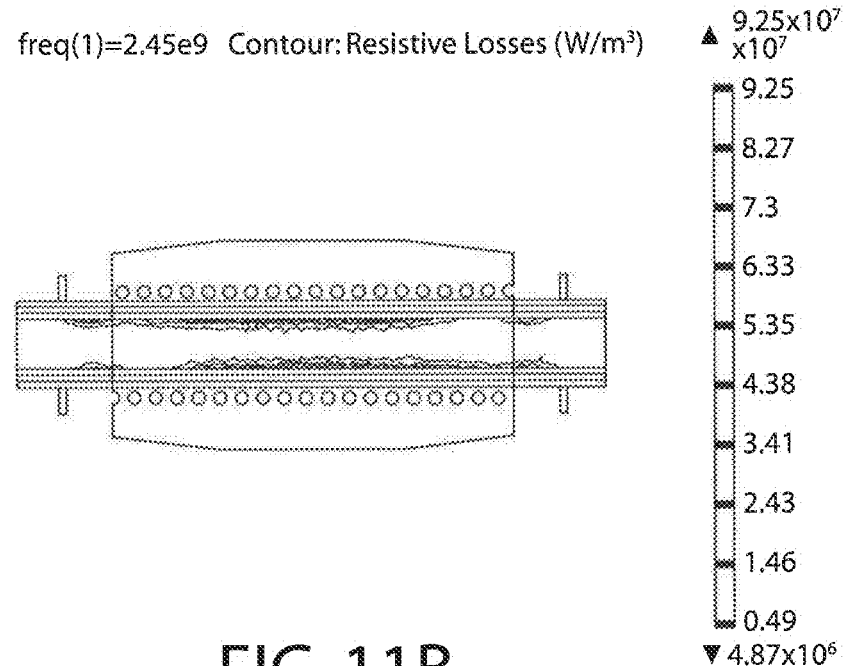

FIGS. 11A and 11B include schematic diagrams of an operational power absorption profile for the plasma applicator 200 illustrated in FIG. 10. Specifically, FIG. 11A includes a schematic cross-sectional view of the microwave power absorption profile viewed in a direction perpendicular to the direction of the waveguide 272, and FIG. 11B includes a schematic cross-sectional view of the microwave power absorption profile viewed in the direction along the waveguide 272. In this exemplary embodiment, the angle between the minor cross-sectional axis 271 of the waveguide 272 and the longitudinal axis 251 of the plasma discharge tube 250 is 60°. At this angle the uniformity of microwave power absorption is optimized for a dielectric plasma discharge tube of 3.8 cm in diameter and 20 cm in length, as illustrated in FIGS. 11A and 11B.

Figure 12A:
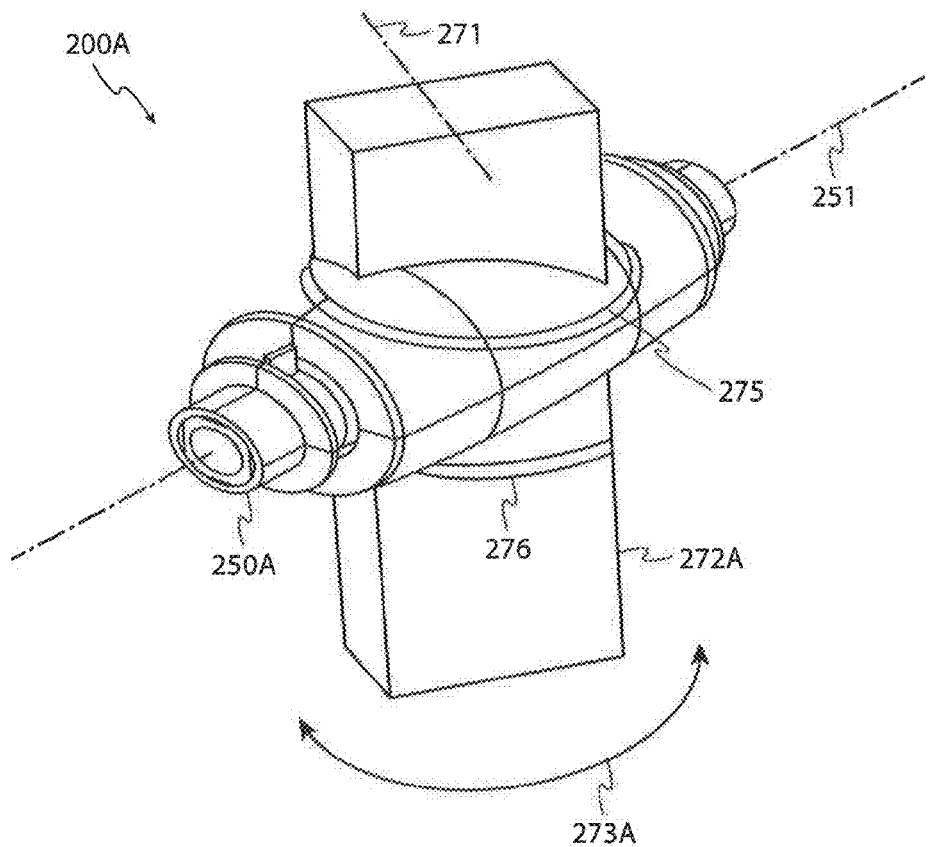
FIG. 12A through 12D include schematic perspective views of another plasma applicator, according to some exemplary embodiments.

FIGS. 12A through 12D include schematic perspective views of another plasma applicator 200A, in which the angle between the minor cross-sectional axis of the waveguide, i.e., the microwave electric field illustrated by arrows or vectors labeled "E," and the longitudinal axis of the plasma discharge tube can be adjusted in real time, according to some exemplary embodiments. Referring to FIG. 12A, the plasma applicator 200A is the same as the plasma applicator 200 of FIG. 10, with the exception that the plasma applicator 200A includes flexible or rotating joints 275 and 276 by which the waveguide 272A is coupled to the microwave cavity 252A and plasma discharge tube 250A. The flexible or rotating joints 275 and 276 permit rotation of the waveguide 272A relative to plasma discharge tube 250A, as indicated by arrow 273A, such that the angle of the microwave electric field relative to the plasma discharge tube 250A can be adjusted in real time, for example, to match specific plasma loads.

Figures 12B, 12C, 12D:
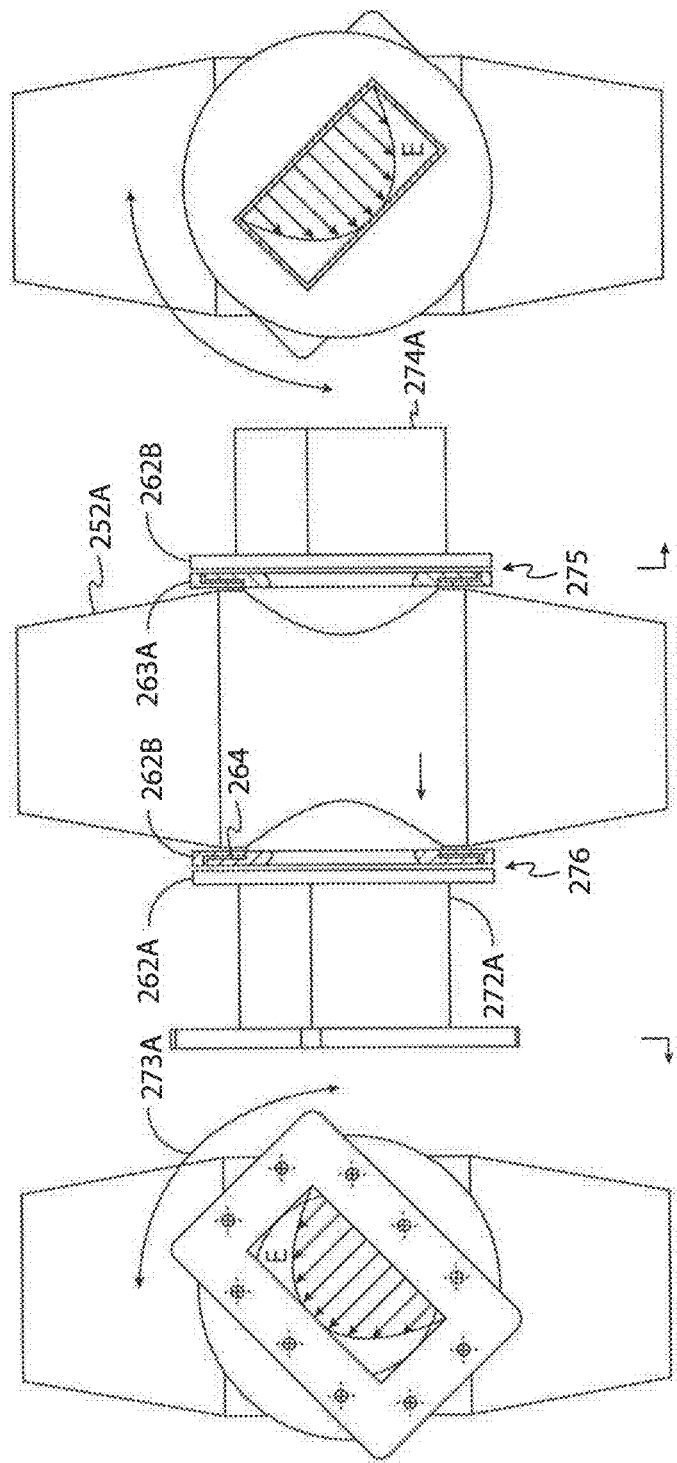

FIGS. 12B through 12D illustrate an exemplary embodiment of the rotating joints 275 and 276 shown in FIG. 12A. Each rotating joint comprises two circular flanges, one fixed on the microwave cavity 252A and the other fixed on the waveguide 272A. The direction of the lowest order microwave electric field in the waveguides is primarily in parallel with the minor cross-sectional axis, as illustrated by the arrows or vectors labeled "E" in FIGS. 12B and 12D. The angles between the microwave cavity 252A and the waveguides facing the front and back side of the cavity can be adjusted by rotating the waveguide sections relative to the microwave cavity. Once a desired angle is obtained, the flanges 262A and 262B (or 263A and 263B) can be clamped and locked. In some embodiments, the surfaces of the interfacing flanges are in electric contact to prevent microwave from leaking out of the joint. In some other embodiments, as shown in FIG. 12C, a microwave choke 264 is assembled in the waveguide flanges 263A or 263B. The use of microwave choke 264 prevents leakage of microwave from the rotating joints when the waveguide flanges are not in electric contact. This makes it more convenient to adjust the relative angle of the rotating joints.

Figure 13:
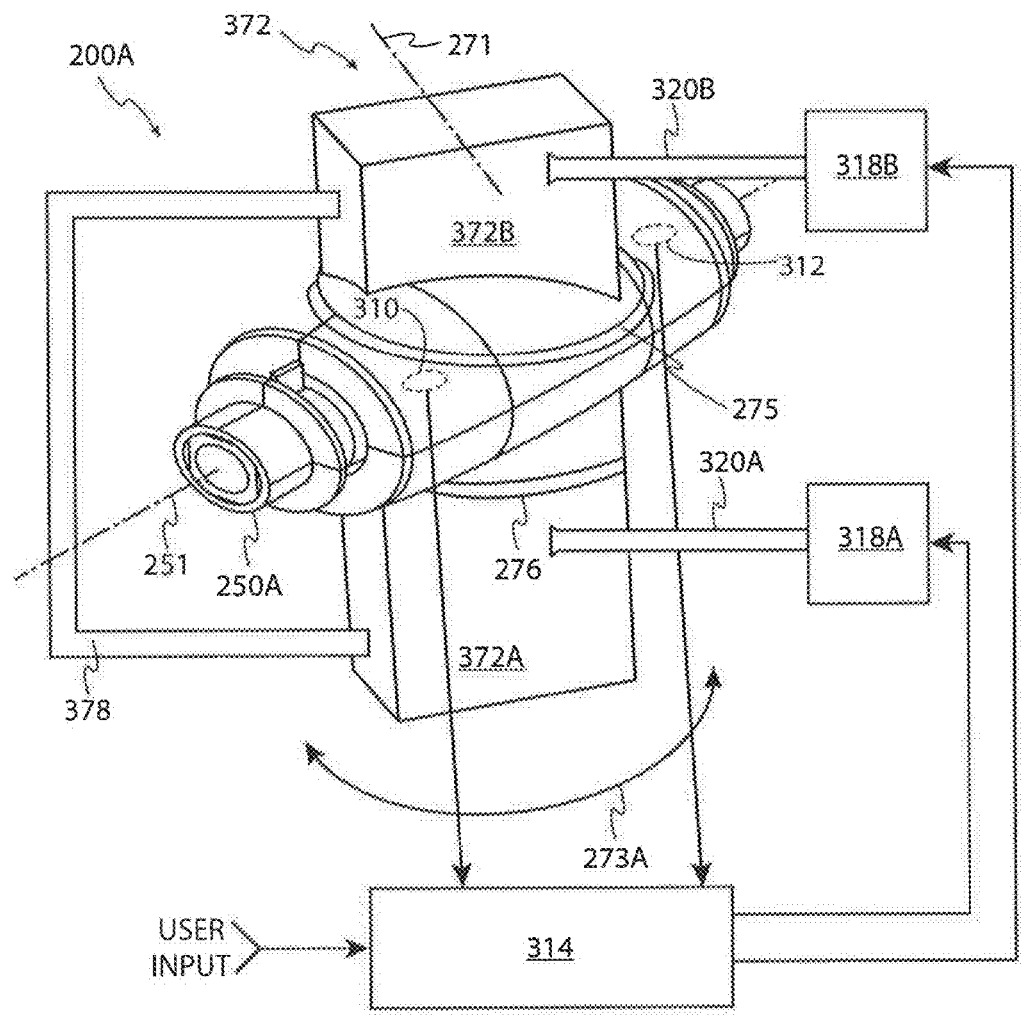
FIG. 13 includes a schematic functional block diagram and perspective view of another plasma applicator, with controllable waveguide rotation, according to some exemplary embodiments.

In some exemplary embodiments, rotation of the waveguide relative to the plasma discharge tube can be precisely controlled such that the angle of the microwave electric field relative to the plasma discharge tube can be adjusted in real time. As a result, real-time adjustment of the microwave power absorption profile, and/or the electromagnetic field distribution and/or the temperature distribution within the plasma discharge tube is realized. FIG. 13 includes a schematic perspective view of a plasma applicator with controllable waveguide rotation, according to some exemplary embodiments. Referring to FIG. 13, rotation of waveguide 372 relative to plasma discharge tube 250A can be controlled via a feedback loop by a processor/controller 314, one or more actuation controllers 318A, 318B and one or more actuators 320A, 320B.

As shown in FIG. 13, plasma discharge tube 250A can be configured with one or more electromagnetic field sensors 310 and/or one or more temperature sensors 312. It will be understood that any number of electromagnetic field sensors 310 and any number of temperature sensors 312, including no electromagnetic field sensors or no temperature sensors can be employed in accordance with the exemplary embodiments, and the sensors can be physically located at a variety of positions in and/or near plasma discharge tube 250, in accordance with the exemplary embodiments. Any and all electromagnetic field sensors at any and all locations are collectively depicted and referred to in FIG. 13 by reference numeral 310. Similarly, any and all temperature sensors at any and all locations are collectively depicted and referred to in FIG. 13 by reference numeral 312.

Electromagnetic field sensors 310 can provide signals indicative of electromagnetic field intensity and uniformity in and/or near plasma discharge tube 250A to processor/controller 314. Temperature sensors 312 can provide signals indicative of temperature and its uniformity in and/or near plasma discharge tube 250A to processor/controller 314.

Processor/controller 314 processes the received signals to determine whether a desired electromagnetic field and/or power absorption and/or temperature profile is being achieved. Processor/controller 314 then generates actuation control signals and forwards the signals to one or both actuator controllers 318A, 318B, which control movement, such as, for example, longitudinal displacement, of actuator arms 320A, 320B, respectively. Actuator arm 320A controls rotation of front or lower section 372A of waveguide 372 about rotating joint 276, and actuator arm 320B controls rotation of back or upper section 372B of waveguide 372 about rotating joint 275. Thus, in some exemplary embodiments, using the feedback provided by electromagnetic sensors 310 and/or temperature sensors 312, processor/controller 314 controls rotation of waveguide 372 relative to plasma discharge tube 250A to achieve a desired electromagnetic, power absorption and/or temperature profile within plasma discharge tube 250A.

In some exemplary embodiments, it may be acceptable or desirable to rotate both sections 372A and 372B to the same angle with respect to plasma discharge tube 250A. In such embodiments, only one of actuation controllers 318A, 318B is required; one of actuation controllers 318A, 318E can be eliminated. In this case, an optional rigid attachment member 378 can be used to attach waveguide sections 372A and 372B such that, when one of them is actuated into rotation, the other is carried into the same rotation via the rigid attachment provided by rigid attachment member 378.

In some exemplary embodiments, user input can also be provided by a user to manually control rotation of waveguide 372 with respect to plasma discharge tube 250A. This user input can be in addition to the closed-loop control facilitated by electromagnetic sensors 310 and/or temperature sensors 312. The user input can also be instead of the closed-loop control, i.e., user input can be used instead of the feedback from sensors 310 and/or 312. That is, in some embodiments, open-loop control of rotation of waveguide 372 with respect to plasma discharge tube 250A can be effected via optional user input.

The present disclosure provides an improved microwave plasma applicator for generation of reactive gases for material processing. The approach of the disclosure provides a high uniformity of power absorption in the plasma, thereby lowering peak power flux to the plasma chamber walls and reducing surface erosion. The approach of the disclosure also reduces thermal-mechanical stress on the plasma chamber and increases power capabilities of the plasma applicator. The reduced surface erosion of the chamber walls and reduced thermal-mechanical stress on the plasma chamber results in increased applicator lifetime. A plasma topology is used such that a straight dielectric tube with, for example, a circular, elliptical or rectangular cross-section, can be used as the plasma chamber. This allows wider selection of dielectric materials for the plasma discharge chamber, such as $Al_2O_3$, $Y_2O_3$, YAG, MgO, and/or $SiO_2$, in the form of single crystal or ceramic, to form the plasma chamber and to handle various plasma chemistries. The plasma applicator of the disclosure can operate with highly reactive gases, such as hydrogen, oxygen, nitrogen, fluorine, chlorine, and mixtures of these gases, with fast response to changes in gas flow rates. Examples of the gases include $H_2$, $O_2$, $N_2$, $NF_3$, $Cl_2$, HCl, $NH_3$, $CF_4$, $C_2F_6$, $C_3F_8$, $C_4F_8$, $Cl_3F$, $N_2O$, and H2O. The plasma applicator of the disclosure is operable at a gas flow rate of 0.1 to 100 slm, a gas pressure range of 0.001 to 1000 torr, and a microwave power of 1 to 20 kW. The higher power capability results in increased process throughput. In accordance with the disclosure, erosion of the plasma chamber surface and associated chemical and particle contamination are minimized. Surface recombination or deactivation of excited atomic and molecular gases, such as atomic H, N, O, F, Cl, and Br, are lowered, in order to increase the reactive gas output. A highly-energy-efficient plasma applicator which can be readily integrated into semiconductor fabrication systems is provided in accordance with the disclosure. The processes to which the plasma applicator of the disclosure is applicable include photoresist stripping, anisotropic etching, chemical vapor deposition, atomic layer deposition or etch, surface oxidation and/or nitration, and surface cleaning.

While the exemplary embodiments have been particularly shown and described herein, it will be understood by those of ordinary skill in the art that various changes in form and details may be made therein without departing from the spirit and scope of the following claims.

The invention claimed is:

1. An apparatus for generating plasma, comprising:
a plasma discharge tube substantially transparent to microwave energy, the plasma discharge tube having a longitudinal axis;
a conductive coil wound around an outer surface of the plasma discharge tube, the conductive coil comprising an electrically conductive material;
a microwave cavity surrounding the plasma discharge tube;
a waveguide coupled to the microwave cavity for guiding the microwave energy into the plasma discharge tube such that the plasma is generated in the plasma discharge tube, the waveguide having a rectangular cross-section defining a narrower side of the rectangular cross-section and a wider side of the rectangular cross-section, a first cross-sectional axis of the rectangular cross-section being parallel to the wider side of the rectangular cross-section and a second cross-sectional axis of the rectangular cross-section being parallel to the narrower side of the rectangular cross-section, the second cross-sectional axis being positioned at a predetermined angle with respect to the longitudinal axis of the plasma discharge tube such that an electric field of the microwave energy induces an electric current in the conductive coil, the electric current affecting power absorption in the plasma discharge tube, the predetermined angle being selectable such that power absorption in the plasma discharge tube is according to a predetermined profile with respect to the longitudinal axis of the plasma discharge tube; and
an actuator for receiving a signal to control the predetermined angle.

2. The apparatus of claim 1, wherein the predetermined angle is such that the second cross-sectional axis is oriented substantially perpendicular to the longitudinal axis of the plasma discharge tube.

3. The apparatus of claim 1, wherein the predetermined angle is such that the second cross-sectional axis is oriented at an angle of 30° to 90° with respect to the longitudinal axis of the plasma discharge tube.

4. The apparatus of claim 1, wherein the predetermined angle is such that the second cross-sectional axis is oriented at an angle of 45° to 90° with respect to the longitudinal axis of the plasma discharge tube.

5. The apparatus of claim 1, wherein the predetermined angle is selected to increase uniformity of power absorption with respect to the longitudinal axis of the plasma discharge tube.

6. The apparatus of claim 1, wherein the conductive coil comprises a plurality of loops around the plasma discharge tube, the plurality of loops defining a pattern of spacing between adjacent loops, the pattern of spacing being selectable based on a predetermined desired effect of the current induced in the conductive coil on the power absorption in the plasma discharge tube.

7. The apparatus of claim 6, wherein the pattern of spacing between adjacent loops is selected to increase uniformity of power absorption with respect to the longitudinal axis of the plasma discharge tube.

8. The apparatus of claim 6, wherein the spacing between selected adjacent loops can be decreased to increase the electric current induced in the conductive coil such that propagation of microwave energy in the plasma discharge tube in proximity to the selected adjacent loops increases.

9. The apparatus of claim 6, wherein the spacing between selected adjacent loops can be increased to decrease the electric current induced in the conductive coil such that propagation of microwave energy in the plasma discharge tube in proximity to the selected adjacent loops decreases.

10. The apparatus of claim 1, wherein:
the conductive coil is thermally coupled to the plasma discharge tube;
the conductive coil comprises a channel through which a cooling fluid can flow, such that the cooling fluid removes heat from the plasma discharge tube.

11. The apparatus of claim 1, further comprising a microwave choke at each of two ends of the conductive coil, the microwave chokes substantially preventing leakage of the microwave energy from the plasma discharge tube.

12. The apparatus of claim 1, wherein the conductive coil is helically wound around the outer surface of the plasma discharge tube.

13. The apparatus of claim 1, further comprising at least one of an electromagnetic field sensor for generating a first signal indicative of electromagnetic field intensity in the plasma discharge tube or a temperature sensor for generating a second signal indicative of temperature in the plasma discharge tube, the actuator controlling the predetermined angle based on at least one of the first and second signals.

14. The apparatus of claim 1, wherein the actuator rotates the waveguide with respect to the plasma discharge tube about an axis which is parallel to a longitudinal axis of the waveguide to adjust the predetermined angle, a controller controlling the actuator to control the predetermined angle.

15. An apparatus for generating plasma, comprising:
a plasma discharge tube substantially transparent to microwave energy, the plasma discharge tube having a longitudinal axis;
a conductive coil wound around an outer surface of the plasma discharge tube, the conductive coil comprising an electrically conductive material, an electric field of the microwave energy inducing an electric current in the conductive coil, the electric current affecting power absorption in the plasma discharge tube;
a microwave cavity surrounding the plasma discharge tube;
a waveguide coupled to the microwave cavity for guiding the microwave energy into the plasma discharge tube such that the plasma is generated in the plasma discharge tube, the waveguide having a rectangular cross-section defining a narrower side of the rectangular cross-section and a wider side of the rectangular cross-section, a first cross-sectional axis of the rectangular cross-section being parallel to the wider side of the rectangular cross-section and a second cross-sectional axis of the rectangular cross-section being parallel to the narrower side of the rectangular cross-section;
a rotational coupling device for coupling the waveguide to the plasma discharge tube, the rotational coupling device allowing the waveguide to be rotated with respect to the plasma discharge tube about an axis which is parallel to a longitudinal axis of the waveguide to adjust an angle between the second cross-sectional axis of the waveguide and the longitudinal axis of the plasma discharge tube, such that power absorption in the plasma discharge tube is adjustable via the rotational coupling device to a predetermined profile with respect to the longitudinal axis of the plasma discharge tube; and
an actuator for receiving a signal to adjust the angle between the second cross-sectional axis and the longitudinal axis of the plasma discharge tube.

16. The apparatus of claim 15, further comprising at least one of an electromagnetic field sensor for generating a first signal indicative of electromagnetic field intensity in the plasma discharge tube or a temperature sensor for generating a second signal indicative of temperature in the plasma discharge tube, the actuator controlling the angle between the second cross-sectional axis and the longitudinal axis of the plasma discharge tube based on at least one of the first and second signals.

17. The apparatus of claim 15, wherein the actuator rotates the waveguide with respect to the plasma discharge tube to adjust the angle between the second cross-sectional axis and the longitudinal axis of the plasma discharge tube, a controller controlling the actuator to control the angle between the second cross-sectional axis and the longitudinal axis of the plasma discharge tube.

18. The apparatus of claim 15, wherein the angle between the second cross-sectional axis and the longitudinal axis of the plasma discharge tube is adjustable from 30° to 90°.

19. The apparatus of claim 15, wherein the angle between the second cross-sectional axis and the longitudinal axis of the plasma discharge tube is adjustable from 45° to 90°.

20. The apparatus of claim 15, wherein the angle between the second cross-sectional axis and the longitudinal axis of the plasma discharge tube is adjusted to increase uniformity of power absorption with respect to the longitudinal axis of the plasma discharge tube.

21. The apparatus of claim 15, further comprising a sensor for monitoring axial uniformity of the plasma in the plasma discharge tube.

22. The apparatus of claim 15, wherein the conductive coil comprises a plurality of loops around the plasma discharge tube, the plurality of loops defining a pattern of spacing between adjacent loops, the pattern of spacing being selectable based on a predetermined desired effect of the current induced in the conductive coil on the power absorption in the plasma discharge tube.

23. The apparatus of claim 22, wherein the pattern of spacing between adjacent loops is selected to increase uniformity of power absorption with respect to the longitudinal axis of the plasma discharge tube.

24. The apparatus of claim 22, wherein the spacing between selected adjacent loops can be decreased to increase the electric current induced in the conductive coil such that propagation of microwave energy in the plasma discharge tube in proximity to the selected adjacent loops increases.

25. The apparatus of claim 22, wherein the spacing between selected adjacent loops can be increased to decrease the electric current induced in the conductive coil such that propagation of microwave energy in the plasma discharge tube in proximity to the selected adjacent loops decreases.

26. The apparatus of claim 15, wherein:
the conductive coil is thermally coupled to the plasma discharge tube;
the conductive coil comprises a channel through which a cooling fluid can flow, such that the cooling fluid removes heat from the plasma discharge tube.

27. The apparatus of claim 15, further comprising a microwave choke at each of two ends of the conductive coil, the microwave chokes substantially preventing leakage of the microwave energy from the plasma discharge tube.

28. The apparatus of claim 15, wherein the conductive coil is helically wound around the outer surface of the plasma discharge tube.

29. An apparatus for generating plasma, comprising:
a plasma discharge tube substantially transparent to microwave energy, the plasma discharge tube having a longitudinal axis;
a conductive coil wound around an outer surface of the plasma discharge tube, the conductive coil comprising an electrically conductive material;
a microwave cavity surrounding the plasma discharge tube, and
a waveguide coupled to the microwave cavity for guiding the microwave energy into the plasma discharge tube such that the plasma is generated in the plasma discharge tube, the waveguide having a rectangular cross-section defining a narrower side of the rectangular cross-section and a wider side of the rectangular cross-section, a first cross-sectional axis of the rectangular cross-section being parallel to the wider side of the rectangular cross-section and a second cross-sectional axis of the rectangular cross-section being parallel to the narrower side of the rectangular cross-section, the second cross-sectional axis being positioned at a predetermined angle with respect to the longitudinal axis of the plasma discharge tube such that an electric field of the microwave energy induces an electric current in the conductive coil, the electric current affecting power absorption in the plasma discharge tube, the predetermined angle being selectable such that power absorption in the plasma discharge tube is according to a predetermined profile with respect to the longitudinal axis of the plasma discharge tube, wherein the predetermined angle is between 30° and 90°.

30. The apparatus of claim 29, wherein the predetermined angle is such that the second cross-sectional axis is oriented substantially perpendicular to the longitudinal axis of the plasma discharge tube.

31. The apparatus of claim 29, wherein the predetermined angle is such that the second cross-sectional axis is oriented at an angle of 45° to 90° with respect to the longitudinal axis of the plasma discharge tube.

32. The apparatus of claim 29, wherein the predetermined angle is selected to increase uniformity of power absorption with respect to the longitudinal axis of the plasma discharge tube.

33. The apparatus of claim 29, wherein the conductive coil comprises a plurality of loops around the plasma discharge tube, the plurality of loops defining a pattern of spacing between adjacent loops, the pattern of spacing being selectable based on a predetermined desired effect of the current induced in the conductive coil on the power absorption in the plasma discharge tube.

34. The apparatus of claim 33, wherein the pattern of spacing between adjacent loops is selected to increase uniformity of power absorption with respect to the longitudinal axis of the plasma discharge tube.

35. The apparatus of claim 33, wherein the spacing between selected adjacent loops can be decreased to increase the electric current induced in the conductive coil such that propagation of microwave energy in the plasma discharge tube in proximity to the selected adjacent loops increases.

36. The apparatus of claim 33, wherein the spacing between selected adjacent loops can be increased to decrease the electric current induced in the conductive coil such that propagation of microwave energy in the plasma discharge tube in proximity to the selected adjacent loops decreases.

37. The apparatus of claim 29, wherein:
the conductive coil is thermally coupled to the plasma discharge tube;
the conductive coil comprises a channel through which a cooling fluid can flow, such that the cooling fluid removes heat from the plasma discharge tube.

38. The apparatus of claim 29, further comprising a microwave choke at each of two ends of the conductive coil, the microwave chokes substantially preventing leakage of the microwave energy from the plasma discharge tube.

39. The apparatus of claim 29, wherein the conductive coil is helically wound around the outer surface of the plasma discharge tube.

40. An apparatus for generating plasma, comprising:
a plasma discharge tube substantially transparent to microwave energy, the plasma discharge tube having a longitudinal axis;
a conductive coil wound around an outer surface of the plasma discharge tube, the conductive coil comprising an electrically conductive material, an electric field of the microwave energy inducing an electric current in the conductive coil, the electric current affecting power absorption in the plasma discharge tube;
a microwave cavity surrounding the plasma discharge tube;
a waveguide coupled to the microwave cavity for guiding the microwave energy into the plasma discharge tube such that the plasma is generated in the plasma discharge tube, the waveguide having a rectangular cross-section defining a narrower side of the rectangular cross-section and a wider side of the rectangular cross-section, a first cross-sectional axis of the rectangular cross-section being parallel to the wider side of the rectangular cross-section and a second cross-sectional axis of the rectangular cross-section being parallel to the narrower side of the rectangular cross-section; and
a rotational coupling device for coupling the waveguide to the plasma discharge tube, the rotational coupling device allowing the waveguide to be rotated with respect to the plasma discharge tube about an axis which is parallel to a longitudinal axis of the waveguide to adjust an angle between the second cross-sectional axis of the waveguide and the longitudinal axis of the plasma discharge tube, such that power absorption in the plasma discharge tube is adjustable via the rotational coupling device to a predetermined profile with respect to the longitudinal axis of the plasma discharge tube.

41. The apparatus of claim 40, wherein the angle between the second cross-sectional axis and the longitudinal axis of the plasma discharge tube is adjustable from 30° to 90°.

42. The apparatus of claim 40, wherein the angle between the second cross-sectional axis and the longitudinal axis of the plasma discharge tube is adjustable from 45° to 90°.

43. The apparatus of claim 40, wherein the angle between the second cross-sectional axis and the longitudinal axis of the plasma discharge tube is adjusted to increase uniformity of power absorption with respect to the longitudinal axis of the plasma discharge tube.

44. The apparatus of claim 40, further comprising a sensor for monitoring axial uniformity of the plasma in the plasma discharge tube.

45. The apparatus of claim 40, wherein the conductive coil comprises a plurality of loops around the plasma discharge tube, the plurality of loops defining a pattern of spacing between adjacent loops, the pattern of spacing being selectable based on a predetermined desired effect of the current induced in the conductive coil on the power absorption in the plasma discharge tube.

46. The apparatus of claim 45, wherein the pattern of spacing between adjacent loops is selected to increase uniformity of power absorption with respect to the longitudinal axis of the plasma discharge tube.

47. The apparatus of claim 45, wherein the spacing between selected adjacent loops can be decreased to increase the electric current induced in the conductive coil such that propagation of microwave energy in the plasma discharge tube in proximity to the selected adjacent loops increases.

48. The apparatus of claim 45, wherein the spacing between selected adjacent loops can be increased to decrease the electric current induced in the conductive coil such that propagation of microwave energy in the plasma discharge tube in proximity to the selected adjacent loops decreases.

49. The apparatus of claim 40, wherein:
the conductive coil is thermally coupled to the plasma discharge tube;
the conductive coil comprises a channel through which a cooling fluid can flow, such that the cooling fluid removes heat from the plasma discharge tube.

50. The apparatus of claim 40, further comprising a microwave choke at each of two ends of the conductive coil, the microwave chokes substantially preventing leakage of the microwave energy from the plasma discharge tube.

51. The apparatus of claim 40, wherein the conductive coil is helically wound around the outer surface of the plasma discharge tube.

* * * * *